US005583502A

United States Patent [19]
Takeuchi et al.

[11] Patent Number: 5,583,502
[45] Date of Patent: Dec. 10, 1996

[54] A-D CONVERTER TESTING CIRCUIT AND D-A CONVERTER TESTING CIRCUIT

[75] Inventors: Sumitaka Takeuchi; Toshio Kumamoto, both of Itami, Japan

[73] Assignee: Mitsubishi Denki Kabushiki Kaisha, Tokyo, Japan

[21] Appl. No.: 263,429

[22] Filed: Jun. 21, 1994

[30] Foreign Application Priority Data

Nov. 4, 1993 [JP] Japan .................................. 5-275456

[51] Int. Cl.$^6$ ........................................... H03M 1/10
[52] U.S. Cl. ............................................... 341/120
[58] Field of Search .................................. 341/120, 144, 341/155

[56] References Cited

U.S. PATENT DOCUMENTS

| | | | |
|---|---|---|---|
| 4,538,266 | 8/1985 | Miki | 341/120 |
| 4,736,189 | 4/1988 | Katsumata et al. | 341/120 |
| 4,835,535 | 5/1989 | Shibayama et al. | 341/120 |
| 5,124,704 | 6/1992 | Kase et al. | 341/120 |

OTHER PUBLICATIONS

Technical report of the Institute of Electronics, Information and Communication Engineers, ICD 89–119, Y. Okada, et al., "A Video Signal Processing LSI with AD/DA Converters", pp. 57–63.

Spring Conference 1992 of the Institute of Electronics, Information and Communication Engineers, S. Marukawa, et al., "Video Processing LSI with Multiple High Speed ADC", 1 page.

Technical Report of the Institute of Electronics, Information and Communication Engineers, ICD 92–120, Dec. 1992, Eiichi Teraoka, et al., "Built–In Self–Test in a Mixed–Signal Digital Signal Processor", pp. 39–44 (with English abstract).

Primary Examiner—Howard L. Williams
Attorney, Agent, or Firm—Oblon, Spivak, McClelland, Maier & Neustadt, P.C.

[57] ABSTRACT

There is disclosed an A-D converter testing circuit wherein exclusive-OR gates (13a, 13b) provide the exclusive-OR of the high-order bits ($D_{1a}$, $D_{1b}$) of the outputs of A-D converters (12a, 12b) and the exclusive-OR of the high-order bits ($D_{1b}$, $D_{1c}$) of the outputs of A-D converters (12b, 12c), respectively, and an OR gate (13c) provides the logical sum of the outputs of the both gates, which is "L" if all of the bits ($D_{1a}$, $D_{1b}$, $D_{1c}$) are equal. A tri-state buffer (15a) receives the output of the OR gate (13c) at its control end and receives the bit ($D_{1c}$) at its input. When all of the A-D converters are normal, all of the bits ($D_{1a}$, $D_{1b}$, $D_{1c}$) are equal and are applied to the output of the tri-state buffer (15a). When one or some of the A-D converters are abnormal, the output of the tri-state buffer (15a) enters a high-impedance state. The A-D converter testing circuit, therefore, rapidly judges whether the A-D converters are defective or non-defective.

33 Claims, 27 Drawing Sheets

A-D CONVERTER TESTING CIRCUIT AND D-A CONVERTER TESTING CIRCUIT

BACKGROUND OF THE INVENTION

1. Field of the Invention

The present invention relates to a technique for testing an A-D converter or a D-A converter and, more particularly, to a technique for simultaneously testing a plurality of A-D converters or a plurality of D-A converters.

2. Description of the Background Art

Recent advances in the fields of semiconductor technology have made it possible to convert picture signals and aural signals which are continuous analog quantities into discrete digital quantities and process them in the form of digital signals, instead of processing them in the form of analog signals, to achieve a multi-functional, high-accuracy system. This has provided accomplishment of an A-D (analog-to-digital) converter and a D-A (digital-to-analog) converter, which have been used separately from a digital signal processing circuit, on the same semiconductor integrated circuit as the digital signal processing circuit.

FIG. 27 is a block diagram of a signal processing system 101. The signal processing system 101 receives an analog signal AI and outputs an analog signal AO. The signal processing system 101 comprises an A-D converter 102, a digital signal processing circuit 103, and a D-A converter 104 which are connected in series.

The analog signal AI applied to the signal processing system 101 is sampled on a constant cycle and analog-to-digital converted into a digital signal DI by the A-D converter 102. The digital signal processing circuit 103 receives the digital signal DI and performs a predetermined digital signal processing to output a resultant digital signal DO. The D-A converter 104 digital-to-analog converts the digital signal DO into the analog signal AO. The signal processing system 101 as above constructed is formed on the same semiconductor integrated circuit.

More than one A-D converter and more than one D-A converter are formed on the same semiconductor integrated circuit. FIG. 28 is a block diagram of a semiconductor integrated circuit disclosed in Preceeding of the 1992 IEICE Spring Conference, C-611, Marukawa et al., wherein two A-D converters and two D-A converters are shown as integrated.

The A-D converters and D-A converters contained in the semiconductor integrated circuit are sometimes required to be subjected to performance evaluation thereof or discrimination between the non-defective and defective when mass-produced. In such cases, a testing method of evaluating the A-D converters equipped with test terminals in the same manner as a single A-D converter has been well known in the art. Another known testing method is to multiplex the functions of the test terminals and switch between a test state and an actual operation state to suppress substantial increase in the number of terminals.

A further known testing method is to provide a means for selecting A-D converters in the circuit to test only the selected A-D converters. FIG. 29 is a block diagram showing a method of testing an A-D converter and a D-A converter which is disclosed in Technical Report ICD89-119 (IEICE), Okada et al. In the disclosed method, analog data for use in testing the A-D converter are applied to the A-D converter through an analog switch, and then the A-D converter converts the analog data into a digital signal which is in turn applied to an I/O buffer through a switch and a test bus.

For testing a plurality of A-D converters, a block selecting register selects another A-D converter. This enables the plurality of A-D converters contained in the semiconductor integrated circuit to be evaluated in the same manner as a single A-D converter.

The performance evaluation or discrimination between the defective and non-defective when mass-produced performed in the conventional testing methods on a plurality of A-D converters and a plurality of D-A converters contained in the semiconductor integrated circuit, requires separate test terminals for the A-D converters, resulting in a need for terminals of the semiconductor integrated circuit which are equal in number to the test terminals when the plurality of A-D converters are contained in the semiconductor integrated circuit.

To avoid this problem, the functions of the test terminals have been multiplexed or the A-D converters to be tested have been selected for testing. However, this causes another problem of an extremely large amount of time for testing all of the A-D converters and D-A converters.

In particular, it is practically difficult to use such testing methods to discriminatingly select the non-defective products in mass production because of time restriction. Further, the above-mentioned problem grows more pronounced as the A-D converters and D-A converters contained in the same semiconductor integrated circuit increase in number and the degree of integration thereof increases.

SUMMARY OF THE INVENTION

The present invention is intended for an A-D converter testing circuit for testing whether a plurality of A-D converters are defective or non-defective, each of the plurality of A-D converters providing a converter output that is a digital signal. According to the present invention, the A-D converter testing circuit comprises: (a) a coincidence detecting circuit for detecting whether or not all of the converter outputs of the A-D converters coincide to output a coincidence detection signal; and (b) an output portion controlled by the coincidence detection signal for providing a test result output indicative of the defective/non-defective of the A-D converters.

In the A-D converter testing circuit according to the present invention, the same analog signal is applied to all of the A-D converters. If all the A-D converters are normal, the converter outputs therefrom are equal. Thus, the coincidence detection signal is activated, and the output portion controlled by the coincidence detection signal provides the test result output.

Whether all of the A-D converters are normal or not is detected at one time, and the defective/non-defective thereof is judged rapidly.

In another aspect of the present invention, an A-D converter testing circuit for testing whether M A-D converters are defective or non-defective, each of the M A-D converters providing a converter output that is an N-bit digital signal, comprises: (a) switches $S_{KL}$ ($1 \leq K \leq M$, $1 \leq L \leq N$) each having a first end, a second end receiving an L-th bit of the converter output outputted from an K-th one of the A-D converters, and a control end for controlling whether to transmit a value impressed upon its second end to its first end or not; (b) a control terminal commonly connected to all of the control ends of the switches $S_{KL}$ and receiving a selection signal; and (c) test result output terminals $T_L$ for commonly connecting the first ends of the switches $S_{1L}$, $S_{2L}$, . . . , $S_{ML}$ to each other.

In the A-D converter testing circuit of the second aspect according to the present invention, the same analog signal is applied to all of the A-D converters. If all the A-D converters are normal, one of the two complementary values is provided at the test result output terminal. If one or some of the A-D converters are abnormal, an intermediate value between the two complementary values is provided at the test result output terminal.

Whether all of the A-D converters are normal or not is detected at one time, and the defective/non-defective thereof is judged rapidly.

In particular, when an abnormality occurs in the A-D converters, the intermediate potential between "H" and "L" is applied to the test result output terminal, thereby facilitating the detection thereof.

The present invention is also intended for a D-A converter testing circuit for testing whether a plurality of D-A converters are defective or non-defective, each of the D-A converters digital-to-analog converting a digital signal to provide a converted current. According to the present invention, the D-A converter testing circuit comprises: (a) a test signal input circuit for applying a digital test signal to the D-A converters; and (b) an output portion for outputting the sum of the converted currents of the D-A converters.

In the D-A converter testing circuit according to the present invention, the test signal is applied to the D-A converters. If all of the D-A converters are normal, the sum of the converted currents is proportional to the value of the test signal.

Whether all of the D-A converters are normal or not is detected at one time by measuring the converted current provided at the test result output terminal in corresponding relation to the varying test signal. The defective/non-defective of the D-A converters is judged rapidly.

In another aspect of the present invention, a D-A converter testing circuit for testing whether 2M D-A converters are defective or non-defective, each of the 2M D-A converters having N inputs receiving an N-bit digital signal for each bit for digital-to-analog convening the digital signal to provide a converted current, comprises: (a) N test signal input terminals receiving an N-bit test signal for each bit; (b) a test result output terminal; (c) switches $S_{JL}$ ($1 \leq J \leq M$, $1 \leq L \leq N$) each having a first end connected to an L-th one of the inputs of a J-th one of the D-A converters, a second end receiving a value applied to an L-th one of the test signal input terminals, and a control end for controlling whether to transmit a value impressed upon its second end to its first end or not; (d) switches $S_{KL}$ ($(M+1) \leq K \leq 2M$) each having a first end connected to the L-th input of a K-th one of the D-A converters, a second end receiving a value complementary to the value applied to the L-th test signal input terminal, and a control end for controlling whether to transmit a value impressed upon its second end to its first end or not; (e) a control terminal commonly connected to all of the control ends of the switches $S_{JL}$, $S_{KL}$ and receiving a selection signal; and (f) an output portion for controlling whether to apply all of the converted currents of the D-A converters to the test result output terminal or not on the basis of the selection signal.

In the D-A converter testing circuit of this aspect according to the present invention, the test signal is applied to the first to M-th D-A converters. The signal complementary to the test signal is applied to the (M+1)-th to 2M-th D-A converters. If all of the D-A converters are normal, the converted current is constant at the test result output terminal even when the test signal value changes. If one or some of the D-A converters are abnormal, the converted current at the test result output terminal changes with the changes of the test signal value.

Whether all of the D-A converters are normal or not is detected at one time by measuring the converted current provided at the test result output terminal in corresponding relation to the varying test signal. The defective/non-defective of the D-A converters is judged rapidly.

The constant converted current is provided when all the D-A converter are normal, thereby facilitating the detection thereof.

It is an object of the present invention to provide a circuit for testing an increasing number of A-D and D-A converters which is capable of rapidly judging whether they are defective or non-defective.

These and other objects, features, aspects and advantages of the present invention will become more apparent from the following detailed description of the present invention when taken in conjunction with the accompanying drawings.

DESCRIPTION OF THE PREFERRED EMBODIMENTS

A. First Preferred Embodiment

(A-1) Basic Concept

Figure 1:
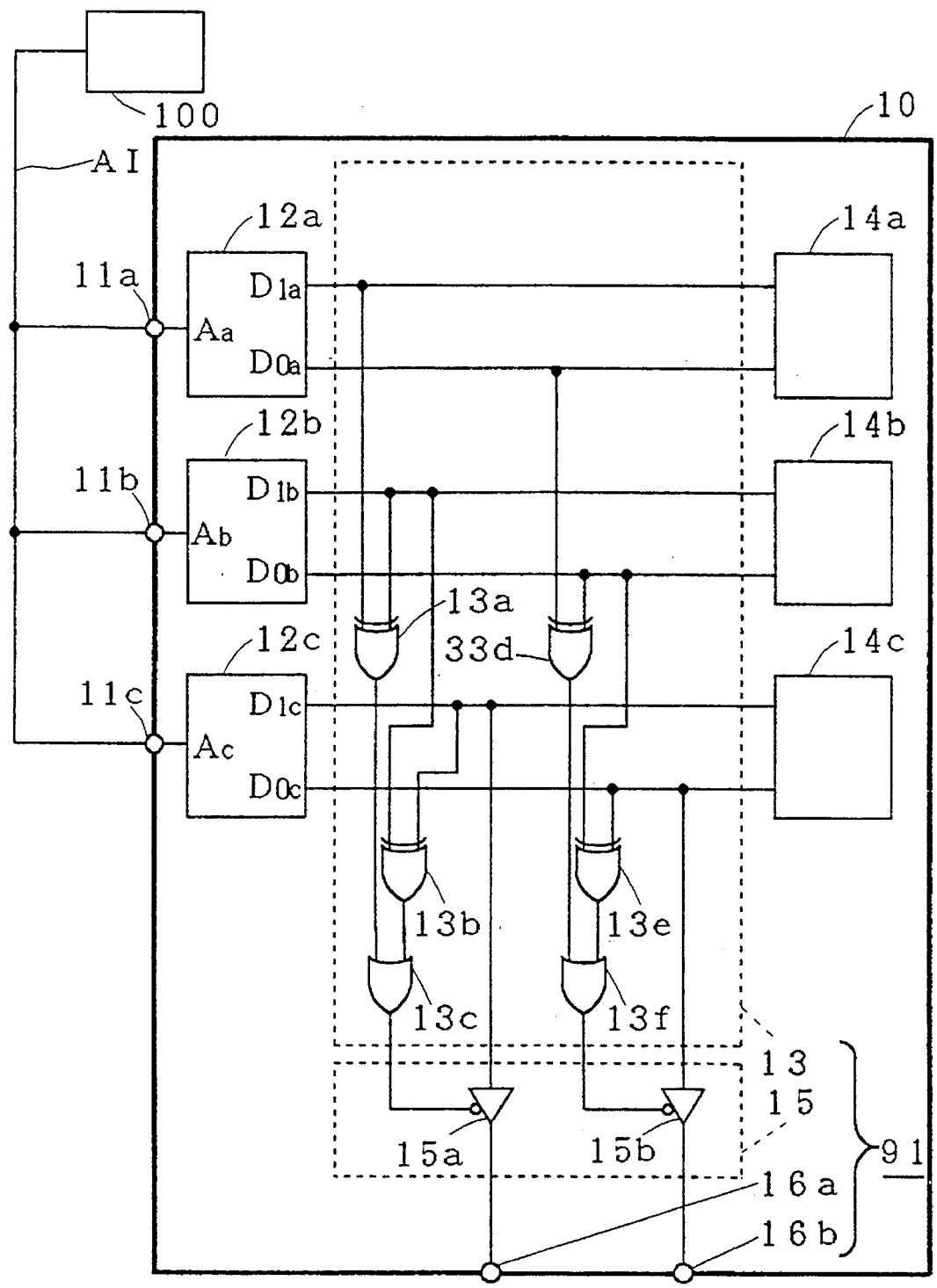
FIGS. 1 to 4 are circuit diagrams showing a construction of a first preferred embodiment according to the present invention.

FIG. 1 is a circuit diagram showing the construction of a semiconductor integrated circuit 10 including an A-D converter testing circuit 91 according to a first preferred embodiment of the present invention. The semiconductor integrated circuit 10 comprises three analog input terminals 11a, 11b, 11c, 2-bit A-D converters 12a, 12b, 12c corresponding to the analog input terminals 11a, 11b, 11c, digital signal processing circuits 14a, 14b, 14c corresponding to the A-D converters 12a, 12b, 12c, and the A-D converter testing circuit 91 according to the present invention including a coincidence detecting circuit 13, an output portion 15, and test result output terminals 16a, 16b.

The A-D converters 12a, 12b, 12c analog-to-digital convert analog signals $A_a$, $A_b$, $A_c$ applied to the analog input terminals 11a, 11b, 11c to transmit 2-bit digital signals $D_{1a}D_{0a}$, $D_{1b}D_{0b}$, $D_{1c}D_{0c}$ to the digital signal processing circuits 14a, 14b, 14c, respectively. Relation between the A-D converters 12a, 12b, 12c and the digital signal processing circuits 14a, 14b, 14c in the semiconductor integrated circuit 10 is similar to relation between the A-D converter 102 and the digital signal processing circuit 103 in the signal processing system 101 of the background art shown in FIG. 27, and the digital signals $D_{1a}D_{0a}$, $D_{1b}D_{0b}$, $D_{1c}D_{0c}$ correspond to the digital signal DI.

The coincidence detecting circuit 13 is connected to the A-D converters 12a, 12b, 12c in parallel with the digital signal processing circuits 14a, 14b, 14c. The coincidence detecting circuit 13 includes four exclusive-OR gates 13a, 13b, 13d, 13e and two OR gates 13c, 13f. The output portion 15 includes two tri-state buffers 15a, 15b.

For testing the A-D converters 12a, 12b, 12c, the same analog signal AI is applied to all of the analog input terminals 11a, 11b, 11c. This is achieved, for example as shown in FIG. 1, by commonly connecting the analog input terminals 11a, 11b, 11c to an analog signal generator 100.

All of the A-D converters 12a, 12b, 12c, if normal, output equal digital signals $D_{1a}D_{0a}$, $D_{1b}D_{0b}$, $D_{1c}D_{0c}$ in response to the same analog signal AI. The coincidence detecting circuit 13 detects whether or not the digital signals $D_{1a}D_{0a}$, $D_{1b}D_{0b}$, $D_{1c}D_{0c}$ coincide with each other. Thus, whether all of the A-D converters 12a, 12b, 12c are normal or not is judged from the output of the coincidence detecting circuit 13. The output portion 15 transmits the judgement to the exterior through the test result output terminals 16a, 16b, 16c.

(A-2) Coincidence Detecting Circuit 13

Two inputs of the exclusive-OR gate 13a are connected to the respective high-order bit outputs of the A-D converters 12a, 12b. That is, the digital signals $D_{1a}$, $D_{1b}$ are applied to the two inputs of the exclusive-OR gates 13a, respectively. Likewise, two inputs of the exclusive-OR gate 13b are connected to the respective high-order bit outputs of the A-D converters 12b, 12c. That is, the digital signals $D_{1b}$, $D_{1c}$ are applied to the two inputs of the exclusive-OR gates 13b, respectively. The OR-gate 13c computes and outputs the logical sum of the outputs of the exclusive-OR gates 13a and 13b. Thus, the OR-gate 13c outputs "L" only when all of the digital signals $D_{1a}$, $D_{1b}$, $D_{1c}$ coincide at "H" ("1") or "L" ("0"), and outputs "H" in other cases.

Similarly, two inputs of the exclusive-OR gate 13d are connected to the respective low-order bit outputs of the A-D converters 12a, 12b. That is, the digital signals $D_{0a}$, $D_{0b}$ are applied to the two inputs of the exclusive-OR gate 13d, respectively. Likewise, two inputs of the exclusive-OR gate 13e are connected to the respective low-order bit outputs of the A-D converters 12b, 12c. That is, the digital signals $D_{0b}$, $D_{0c}$ are applied to the two inputs of the exclusive-OR gate 13e, respectively. The OR-gate 13f computes and outputs the logical sum of the outputs of the exclusive-OR gates 13d and 13e. Thus, the OR-gate 13f outputs "L" only when all of the digital signals $D_{0a}$, $D_{0b}$, $D_{0c}$ coincide at "H" ("1") or "L" ("0"), and outputs "H" in other cases.

Figure 2:
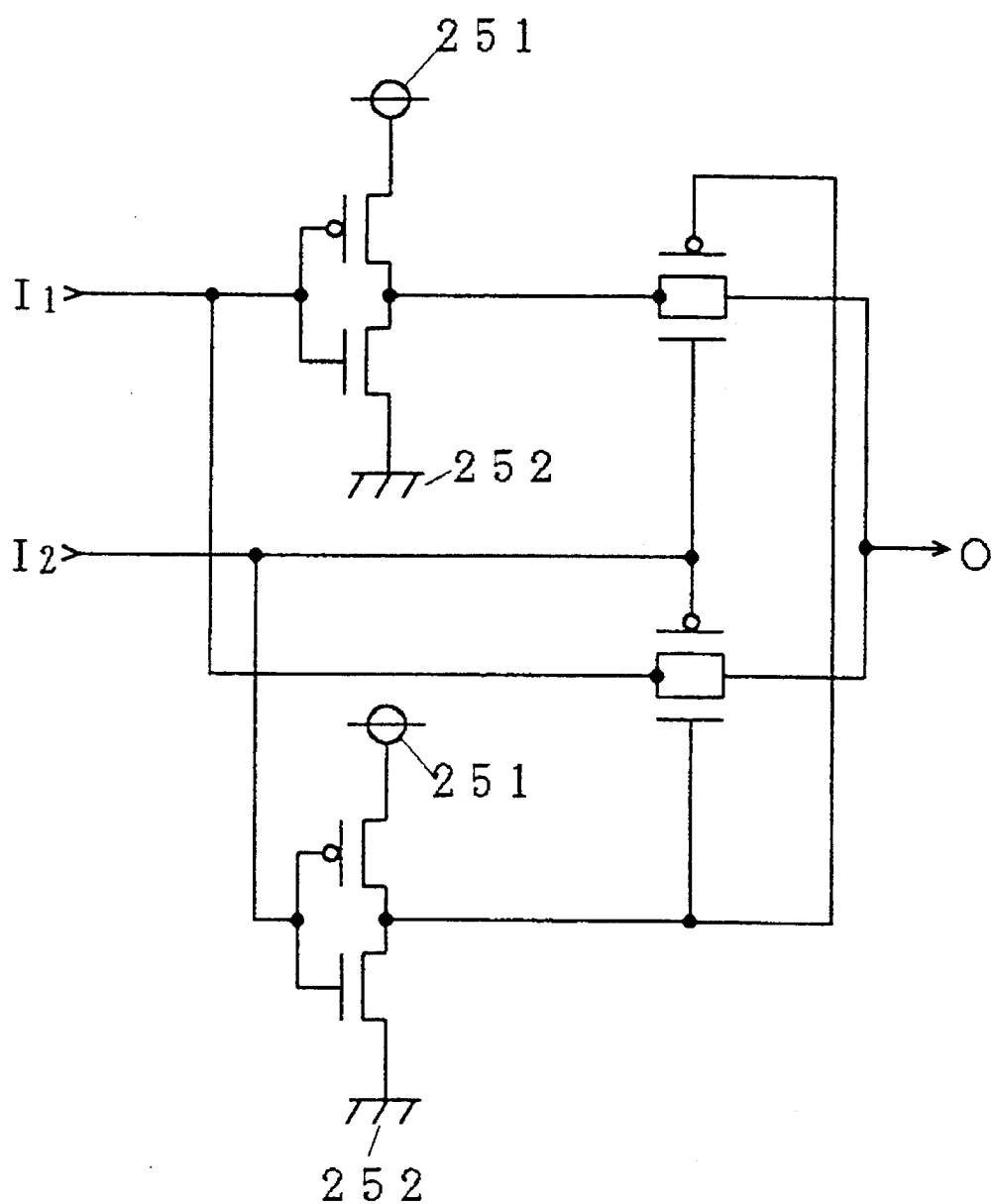
Figure 3:
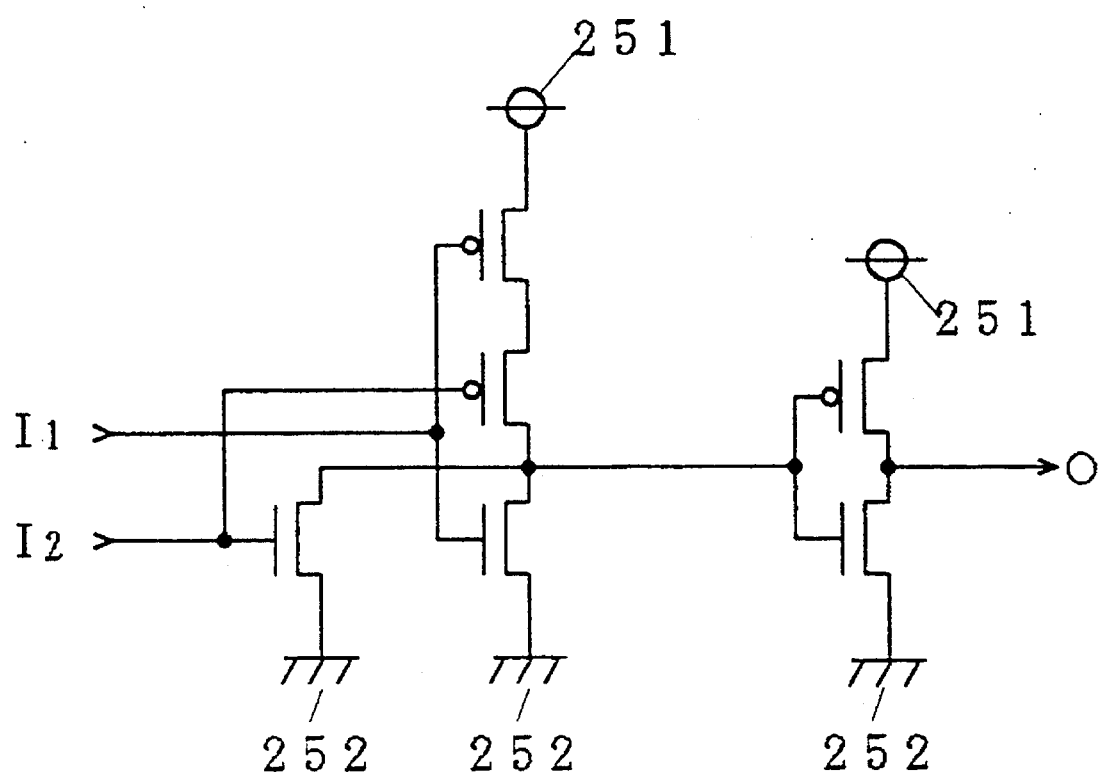

The exclusive-OR gates 13d, 13e and the OR gates 13c, 13f are concretely accomplished by MOS transistors. FIGS. 2 and 3 are circuit diagrams showing aspects of the exclusive-OR gate 13d (13e) and the OR-gate 13c (13f) formed by MOS transistors, respectively. In FIGS. 2 and 3, the reference characters $I_1$ and $I_2$ designate inputs and 0 designates an output. A high potential point 251 corresponds to "H" (for applying a power supply potential in this preferred embodiment), and a low potential point 252 corresponds to "L" (for applying a ground potential in this preferred embodiment).

(A-3) Output Portion 15

Each of the tri-state buffers 15a, 15b in the output portion 15 which has a negative logic control end transmits a signal given at its input intactly to its output when the logic at the control cud is "L", and enters a high-impedance state ("Z") at its output when the logic at the control end is "H".

Figure 4:
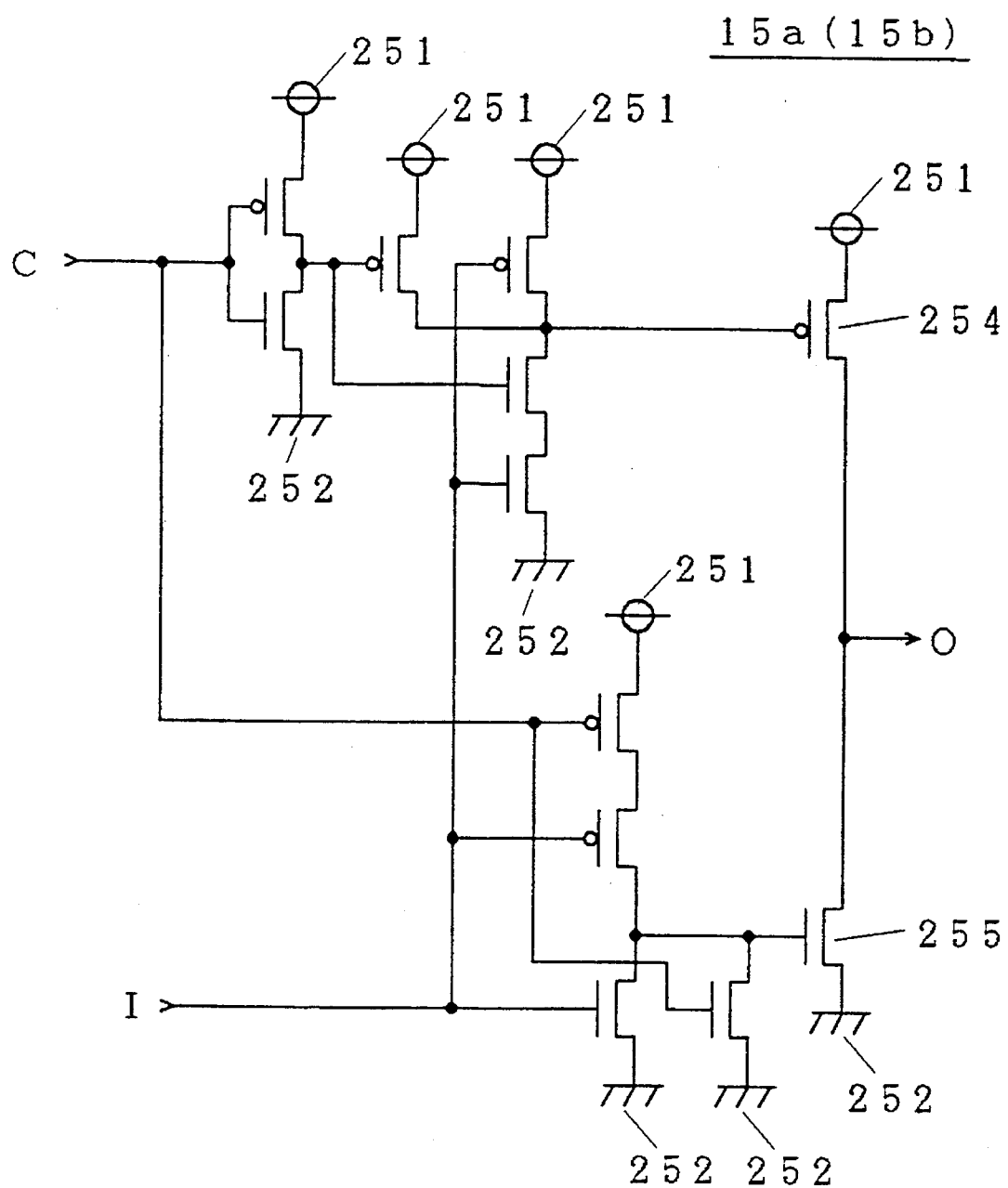

The tri-state buffers 15a and 15b are concretely accomplished by MOS transistors. FIG. 4 is a circuit diagram showing an aspect of the tri-state buffer 15a (15b) formed by MOS transistors. In FIG. 4, the reference character I designates an input, O designates an output, and C designates a control end. There are provided a PMOS transistor 254 and an NMOS transistor 255 connected in series from the high potential point 251 toward the low potential point 252 at the last stage of the tri-state buffer. The drains of the transistors 254 and 255 are commonly connected to the output O.

The gate of the transistor 254 receives the inverse of the logical product of the inverse of the logic applied to the control end C and the logic applied to the input I. The gate of the transistor 255 receives the inverse of the logical sum of the logic applied to the control end C and the logic applied to the input I.

The outputs of the OR-gates 13c, 13f are applied to the control ends of the tri-state buffers 15a, 15b, respectively. The high-order bit output of one of the A-D converters 12a, 12b, 12c (one of the digital signals $D_{1a}$, $D_{1b}$, $D_{1c}$; herein $D_{1c}$) is applied to the input of the tri-state buffer 15a. The low-order bit output of one of the A-D converters 12a, 12b, 12c (one of the digital signals $D_{0a}$, $D_{0b}$, $D_{0c}$; herein $D_{0c}$) is applied to the input of the tri-state buffer 15b.

When all of the A-D converters 12a, 12b, 12c are in normal operation, the digital signals $D_{0a}$, $D_{0b}$, $D_{0c}$ coincide with each other and the digital signals $D_{1a}$, $D_{1b}$, $D_{1c}$ coincide with each other. Then the outputs of the OR-gates 13c, 13f are both "L", and the tri-state buffers 15a and 15b provide the digital signals $D_{1c}$ (=$D_{1a}$=$D_{1b}$) and $D_{0c}$ (=$D_{0a}$=$D_{0b}$) to their outputs, respectively.

When one or some of the A-D converters 12a, 12b, 12c are not in normal operation, they produce different digital signals $D_{1a}D_{0a}$, $D_{1b}D_{0b}$, $D_{1c}D_{0c}$ in response to the same analog signal AI. Then at least one of the outputs of the OR-gates 13c and 13f is "H", and at least one of the tri-state buffers 15a and 15b provides "Z".

All the A-D converters 12a, 12b, 12c are tested by commonly applying to the analog input terminals 11a, 11b, 11c the analog signal AI corresponding to all patterns that the A-D converters 12a, 12b, 12c can output (the analog signal corresponding to four patterns "00" "01", "10", "11" because the A-D converters 12a, 12b, 12c provide two-bit outputs in this preferred embodiment). Unless the test result output terminals 16a, 16b connected to the tri-state buffers 15a, 15b are "Z", all of the A-D converters 12a, 12b, 12c are normal, and the test result output terminals 16a and 16b output the digital signals $D_{1c}$ (=$D_{1a}$=$D_{1b}$) and $D_{0c}$ (=$D_{0a}$=$D_{0b}$), respectively. Abnormal high-order bit output of one of the A-D converters 12a, 12b, 12c is detected by "Z" at the test result output terminal 16a, and abnormal low-order bit output of one of them is detected by "Z" at the test result output terminal 16b.

As above stated, the first preferred embodiment according to the present invention enables the plurality of A-D converters to be simultaneously tested whether they are defective or non-defective, permitting rapid defective/non-defective judgement.

B. Second Preferred Embodiment (B-1) Basic Concept

Figure 5:
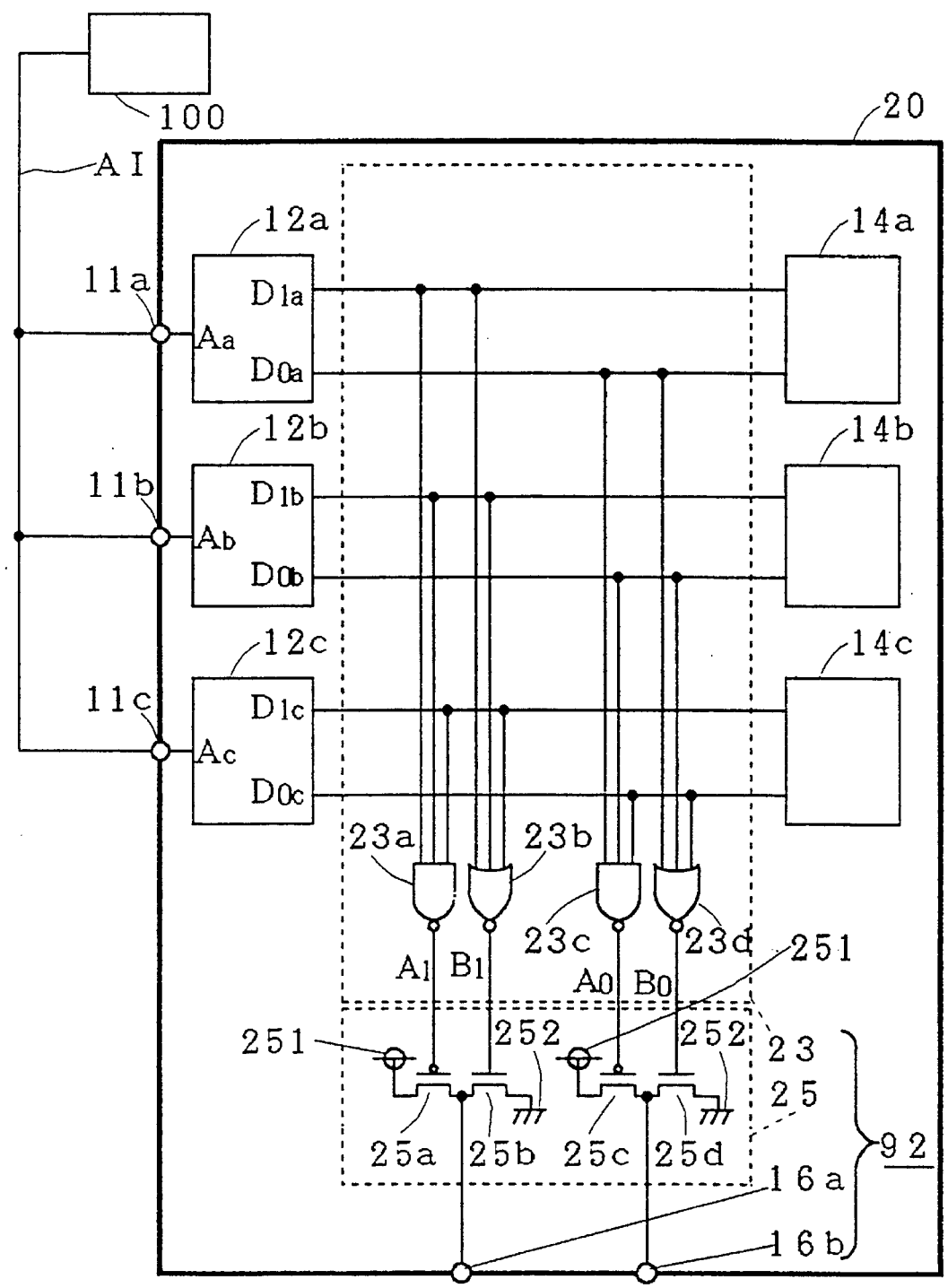
FIGS. 5 to 7 are circuit diagrams showing a construction of a second preferred embodiment according to the present invention.

FIG. 5 is a circuit diagram showing the construction of a semiconductor integrated circuit 20 including an A-D converter testing circuit 92 according to a second preferred embodiment of the present invention. The semiconductor integrated circuit 20 is constructed such that a coincidence detecting circuit 23 and an output portion 25 are substituted for the coincidence detecting circuit 13 and the output portion 15 of the semiconductor integrated circuit 10, respectively. The A-D converter testing circuit 92 includes the coincidence detecting circuit 23, the output portion 25, and the test result output terminals 16a, 16b.

The coincidence detecting circuit 23, similar to the coincidence detecting circuit 13, detects whether or not the digital signals $D_{1a}D_{0a}$, $D_{1b}D_{0b}$, $D_{1c}D_{0c}$ coincide with each other. The coincidence detecting circuit 23 includes two NAND gates 23a, 23c and two NOR gates 23b, 23d.

Figure 6:
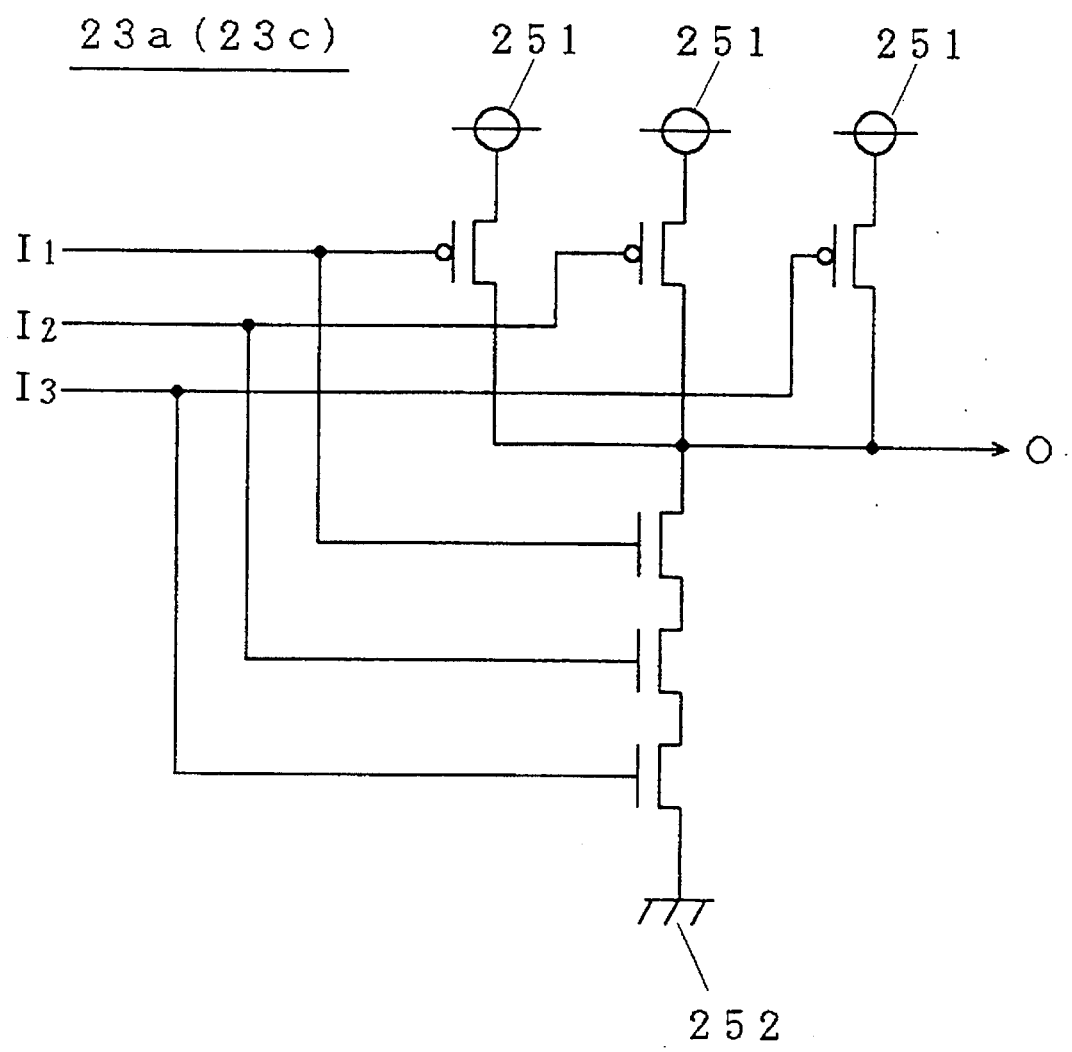
Figure 7:
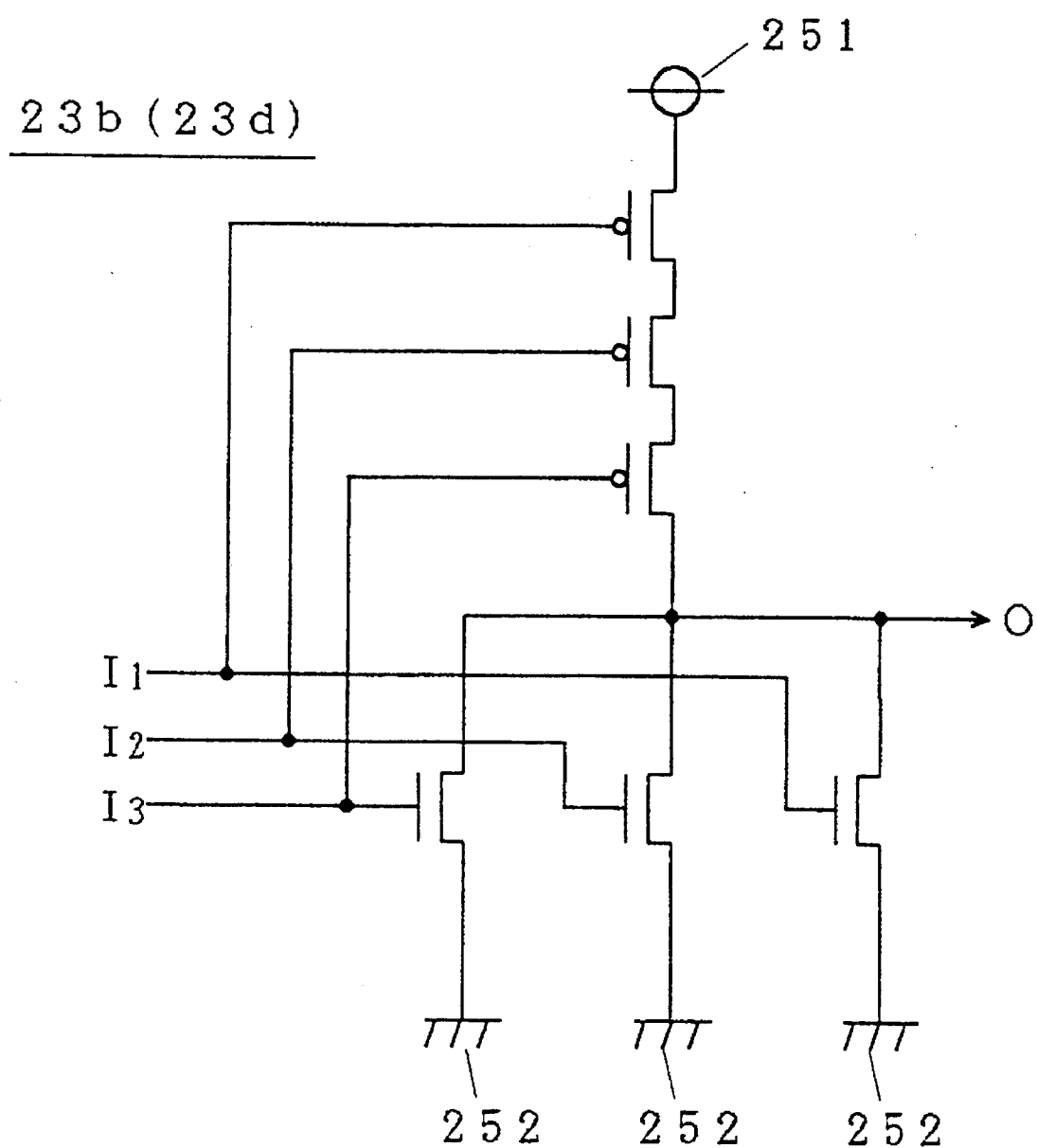

The NAND gates 23a, 23c and the NOR gates 23b, 23d are accomplished by using MOS transistors. FIGS. 6 and 7 are circuit diagrams showing aspects of the NAND gate 23a (23c) and the NOR gate 23b (23d) formed by MOS transistors, respectively. In FIGS. 6 and 7, the reference characters $I_1$, $I_2$, $I_3$ designate inputs and O designates an output.

The output portion 25, similar to the output portion 15, applies "Z" to the test result output terminals 16a, 16b when one or some of the A-D converters 12a, 12b, 12c is abnormal. The output portion 25 includes the high potential point 251, the low potential point 252, PMOS transistors 25a, 25c, and NMOS transistors 25b, 25d.

(B-2) Coincidence Detecting Circuit 23

Three inputs of the NAND gate 23a are connected to the respective high-order bit outputs of the A-D converters 12a, 12b, 12c. That is, the digital signals $D_{1a}$ $D_{1b}$, $D_{1c}$ are applied to the three inputs of the NAND gate 23a, respectively. Likewise, three inputs of the NOR gate 23b are connected to the respective high-order bit outputs of the A-D converters 12a, 12b, 12c. That is, the digital signals $D_{1a}$ $D_{1b}$, $D_{1c}$ are applied to the three inputs of the NOR gate 23b, respectively.

The NAND gate 23a and the NOR gate 23b output coincidence detection signals $A_1$ and $B_1$, respectively. The coincidence detection signal $A_1$, which is the inverse of the logical product of the digital signals $D_{1a}$, $D_{1b}$, $D_{1c}$, provides "L" when all of the digital signals $D_{1a}$, $D_{1b}$, $D_{1c}$ are "H" and provides "H" in other cases. The coincidence detection signal $B_1$, which is the inverse of the logical sum of the digital signals $D_{1a}$, $D_{1b}$, $D_{1c}$, provides "H" when all of the digital signals $D_{1a}$, $D_{1b}$, $D_{1c}$ are "L" and provides "L" in other cases.

It is assumed that all of the A-D converters 12a, 12b, 12c correctly provide the high-order bits $D_{1a}$, $D_{1b}$, $D_{1c}$ of the digital signals. If the three high-order bits are equally "H", the pair of coincidence detection signals ($A_1$, $B_1$) are ("L", "L"). If the three high-order bits are equally "L", the pair of coincidence detection signals ($A_1$, $B_1$) are ("H", "H").

If one or some of the A-D converters 12a, 12b, 12c are in abnormal operation and the three high-order bits do not coincide, the pair of coincidence detection signals ($A_1$, $B_1$) are ("H", "L").

Similarly, three inputs of the NAND gate 23c are connected to the respective low-order bit outputs of the A-D converters 12a, 12b, 12c. That is, the digital signals $D_{0a}$, $D_{0b}$, $D_{0c}$ are applied to the three inputs of the NAND gate 23c, respectively. Likewise, three inputs of the NOR gate 23d are connected to the respective low-order bit outputs of the A-D converters 12a, 12b, 12c. That is, the digital signals $D_{0a}$, $D_{0b}$, $D_{0c}$ are applied to the three inputs of the NOR gate 23d, respectively.

The NAND gate 23c and the NOR gate 23d output coincidence detections signals $A_0$ and $B_0$, respectively. The coincidence detection signal $A_0$, which is the inverse of the logical product of the digital signals $D_{0a}$, $D_{0b}$, $D_{0c}$, provides "L" when all of the digital signals $D_{0a}$, $D_{0b}$, $D_{0c}$ are "H" and provides "H" in other cases. The coincidence detection signal $B_0$, which is the inverse of the logical sum of the digital signals $D_{0a}$, $D_{0b}$, $D_{0c}$, provides "H" when all of the digital signals $D_{0a}$, $D_{0b}$, $D_{0c}$ are "L" and provides "L" in other cases.

If the three low-order bits $D_{0a}$, $D_{0b}$, $D_{0c}$ of the digital signals are equally "H", the pair of coincidence detection signals ($A_0$, $B_0$) are ("L", "L"). If the three are equally "L", the pair of coincidence detection signals ($A_0$, $B_0$) are ("H", "H").

If one or some of the A-D converters 12a, 12b, 12c are in abnormal operation and the three do not coincide, the pair of coincidence detection signals ($A_0$, $B_0$) are ("H", "L").

(B-3) Output Portion 25

The coincidence detection signals $A_1$, $B_1$, $A_0$, $B_0$ are applied to the output portion 25, specifically to the gates of the PMOS transistor 25a, NMOS transistor 25b, PMOS transistor 25c, NMOS transistor 25d, respectively.

The sources of the transistors 25a and 25c are connected to the high potential point 251, and the sources of the transistors 25b, 25d are connected to the low potential point 252. The drains of the transistors 25a, 25b are commonly connected to the test result output terminal 16a, and the drains of the transistors 25c, 25d are commonly connected to the test result output terminal 16b.

On receipt of "L" at their gates, the transistors 25a and 25c, which are of P-channel type, turn on and transmit the potential at the high potential point 251 to the test result output terminals 16a, 16b to output "H" to the exterior. The transistors 25a and 25c turn off, on receipt of "H" at their gates. On receipt of "H" at their gates, the transistors 25b and 25d, which are of N-channel type, turn on and transmit the potential at the low potential point 252 to the test result output terminals 16a, 16b to output "L" to the exterior. The transistors 25b and 25d turn off, on receipt of "L" at their gates.

Since the signals $A_1$ and $B_1$ are provided in the manner described at the end of the previous section "(B-2) Coincidence Detecting Circuit 23", the logic provided to the test result output terminal 16a according to the coincidence/non-coincidence of the high-order bits $D_{1a}$, $D_{1b}$, $D_{1c}$ of the digital signals is as follows:

"H" when all the bits coincide at "H"

"L" when all the bits coincide at "L"

"Z" when the three bits do not coincide

The same is true for the logic provided to the test result output terminal 16b in accordance with the coincidence/non-coincidence of the low-order bits $D_{0a}$, $D_{0b}$, $D_{0c}$ of the digital signals. Therefore, the second preferred embodiment provides effects similar to the first preferred embodiment. Further effects of the second preferred embodiment will be described below.

It will be appreciated from FIG. 2 that eight transistors are required to form one exclusive-OR gate, and it will be appreciated from FIG. 3 that six transistors are required to form one OR gate. In the first preferred embodiment in which the coincidence detecting circuit 13 requires four exclusive-OR gates and two OR gates, it is found that the coincidence detecting circuit 13 requires 44 transistors. It is understood from FIG. 4 that, since one tri-state buffer includes 12 transistors, the output portion 15 requiring two tri-state buffers requires 24 transistors. A total of 68 transistors are required to provide the effects of the first preferred embodiment.

In the second preferred embodiment, on the other hand, the coincidence detecting circuit 23 requires two NAND gates and two NOR gates. It is understood from FIGS. 6 and 7, each one NAND gate and one NOR gate requires six transistors. Accordingly, the coincidence detecting circuit 23 includes 24 transistors. It is found from FIG. 5 that the output portion 25 includes four transistors. A total of 28 transistors only are required to attain the effects of the second preferred embodiment.

As above described, the second preferred embodiment requires fewer transistors than the first preferred embodiment and, accordingly, requires smaller area needed when contained in the semiconductor integrated circuit, thereby permitting less substantial lowering of the integration degree of other elements such as digital signal processing circuits.

C. Third Preferred Embodiment (C-1) Basic Concept

Figure 8:
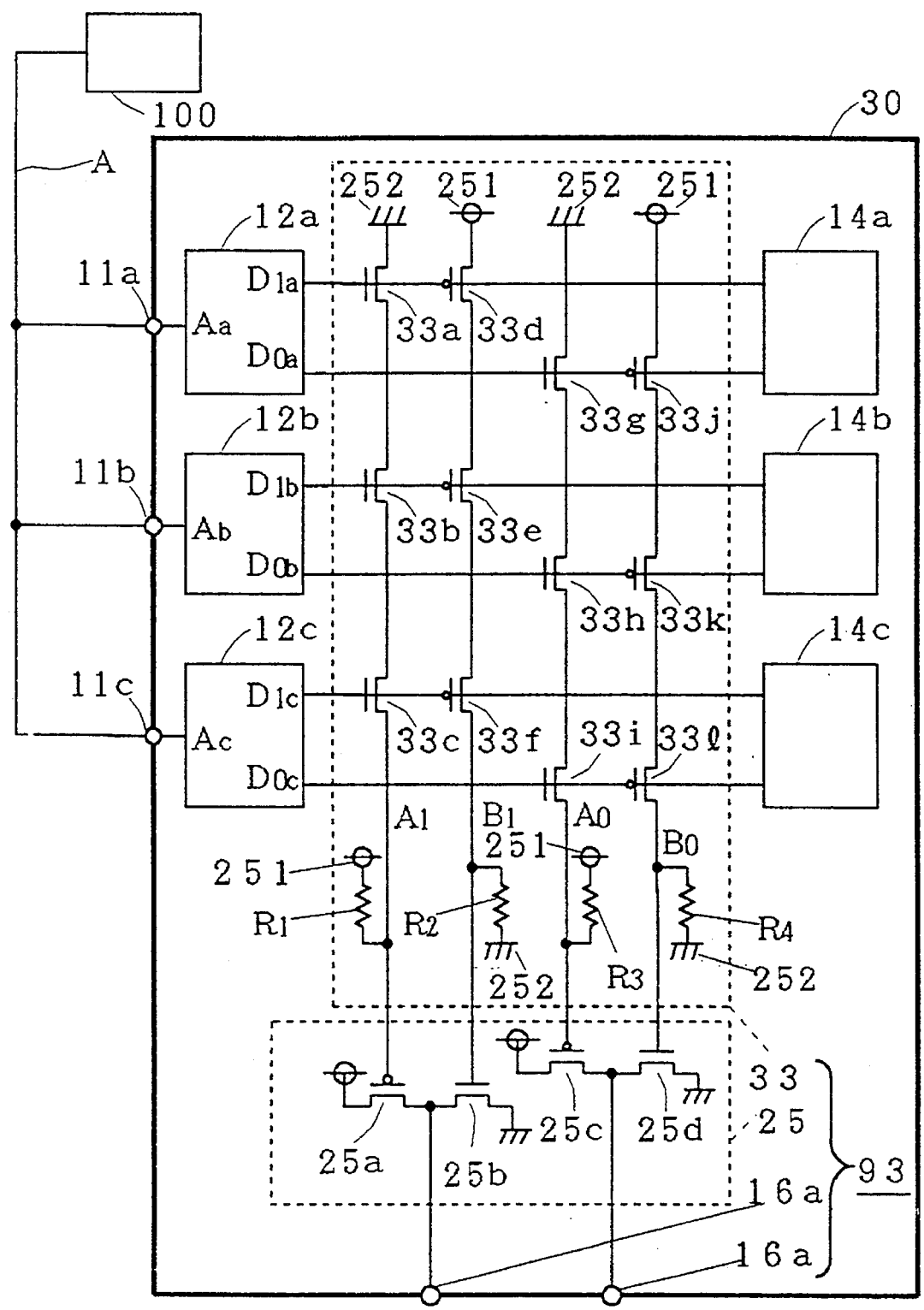
FIG. 8 is a circuit diagram showing a construction of a third preferred embodiment according to the present invention.

FIG. 8 is a circuit diagram showing the construction of a semiconductor integrated circuit 30 including an A-D converter testing circuit 93 according to a third preferred embodiment of the present invention. The semiconductor integrated circuit 30 is constructed such that a coincidence detecting circuit 33 is substituted for the coincidence detecting circuit 23 of the semiconductor integrated circuit 20 of the second preferred embodiment. The A-D converter testing circuit 93 includes the coincidence detecting circuit 33, the output portion 25, and the test result output terminals 16a, 16b.

The coincidence detecting circuit 33, similar to the coincidence detecting circuits 13, 23, detects whether or not the digital signals $D_{1a}D_{0a}$, $D_{1b}D_{0b}$, $D_{1c}D_{0c}$ coincide with each other. The coincidence detecting circuit 33 includes six NMOS transistors 33a, 33b, 33c, 33g, 33h, 33i, six PMOS transistors 33d, 33e, 33f, 33j, 33k, 33l, and four resistors $R_1$, $R_2$, $R_3$, $R_4$.

The coincidence detecting circuit 33, similar to the coincidence detecting circuit 23 of the second preferred embodiment, outputs the coincidence detection signals $A_1$, $B_1$, $A_0$, $B_0$. The output portion 25 receives the coincidence detection signals and acts as described in the second preferred embodiment, providing effects similar to the second preferred embodiment. Thus only the construction and operation of the coincidence detecting circuit 33 will be discussed in the third preferred embodiment.

(C-2) Coincidence Detecting Circuit 33

The gates of the transistors 33a, 33b, 33c are connected to the respective high-order bit outputs of the A-D converters 12a, 12b, 12c. That is, the digital signals $D_{1a}$, $D_{1b}$, $D_{1c}$ are applied to the gates of the transistors 33a, 33b, 33c, respectively. The source of the transistor 33a is connected to the low potential point 252, and the drain thereof is connected to the source of the transistor 33b. The drain of the transistor 33b is connected to the source of the transistor 33c, and the drain of the transistor 33c is connected to the high potential point 251 through the resistor $R_1$. The transistors 33a, 33b, 33c and the resistor $R_1$ are connected in series from the low potential point 252 toward the high potential point 251.

Likewise, the gates of the transistors 33d, 33e, 33f are connected to the respective high-order bit outputs of the A-D converters 12a, 12b, 12c. That is, the digital signals $D_{1a}$, $D_{1b}$, $D_{1c}$ are applied to the gates of the transistors 33d, 33e, 33f, respectively. The source of the transistor 33d is connected to the high potential point 251, and the drain of the transistor 33f is connected to the low potential point 252 through the resistor $R_2$. The transistors 33d, 33e, 33f and the resistor $R_2$ are connected in series from the high potential point 251 toward the low potential point 252.

The drains of the transistors 33c and 33f output the coincidence detection signals $A_1$ and $B_1$, respectively. Only when all of the digital signals $D_{1a}$, $D_{1b}$, $D_{1c}$ are "H", all of the transistors 33a, 33b, 33c which are of N-channel type are on, and the drain of the transistor 33c is at a potential substantially equalling the low potential point 252, the coincidence detection signal $A_1$ being "L". If at least one of the digital signals $D_{1a}$, $D_{1b}$, $D_{1c}$ is "L", the corresponding transistor is off, and the potential at the high potential point 251 is applied to the drain of the transistor 33c through the resistor $R_1$, the coincidence detection signal $A_1$ being "H". On the other hands, only when all of the digital signals $D_{1a}$, $D_{1b}$, $D_{1c}$ are "L", all of the transistors 33d, 33e, 33f which are of P-channel type are on, and the drain of the transistor 33f is at a potential substantially equalling the high potential point 251, the coincidence detection signal $B_1$ being "H". If at least one of the digital signals $D_{1a}$, $D_{1b}$, $D_{1c}$ is "H", the corresponding transistor is off, and the potential at the low potential point 252 is applied to the drain of the transistor 33f through the resistor $R_2$, the coincidence detection signal $B_1$ being "L".

Needless to say, the coincidence detection signals of the third preferred embodiment are identical with those of the second preferred embodiment.

In the same manner, the transistors 33g, 33h, 33i and the resistor $R_3$ are connected in series from the low potential point 252 toward the high potential point 251, and the drain of the transistor 33i outputs the coincidence detection signal $A_0$. The transistors 33j, 33k, 33l and the resistor $R_4$ are connected in series from the high potential point 251 toward the low potential point 252, and the drain of the transistor 33l outputs the coincidence detection signal $B_0$.

The third preferred embodiment can rapidly check whether the A-D converters 12a, 12b, 12c are defective or non-defective by using the coincidence detection signals $A_1$, $B_1$, $A_0$, $B_0$ in the same manner as the second preferred embodiment, as well as providing other effects.

The coincidence detecting circuit 33 requires 12 transistors as above described. On-resistances of transistors may be substituted for the resistors $R_1$, $R_2$, $R_3$, $R_4$. If counting them in, the coincidence detecting circuit 33 and the output portion 25 require a total of 20 transistors, which are fewer than the 68 transistors required in the first preferred embodiment as well as than the 28 transistors required in the second preferred embodiment.

The third preferred embodiment has the new effect of reducing the number of required transistors as well as the effects of the first and second preferred embodiments.

D. Measurement of High-Impedance State

In the first to third preferred embodiments, the defective/non-defective of the A-D converters 12a, 12b, 12c is judged depending on whether they are in high-impedance state or not. Described below is how the high-impedance state is measured.

In the first preferred embodiment, the test result output terminal 16a is connected to the output of the tri-state buffer 15a. It is understood from FIG. 4 that the test result output terminal 16a is commonly connected to the drains of the transistors 254, 255 corresponding to the transistors 25a, 25b of the output portion 25 of the second and third preferred embodiments, respectively. Therefore, only the output portion 25 will be discussed herein. The same is true for the measurement of the test result output terminal 16a of the first preferred embodiment and the measurement of the test result output terminal 16b of the first to third preferred embodiments.

Figure 9:
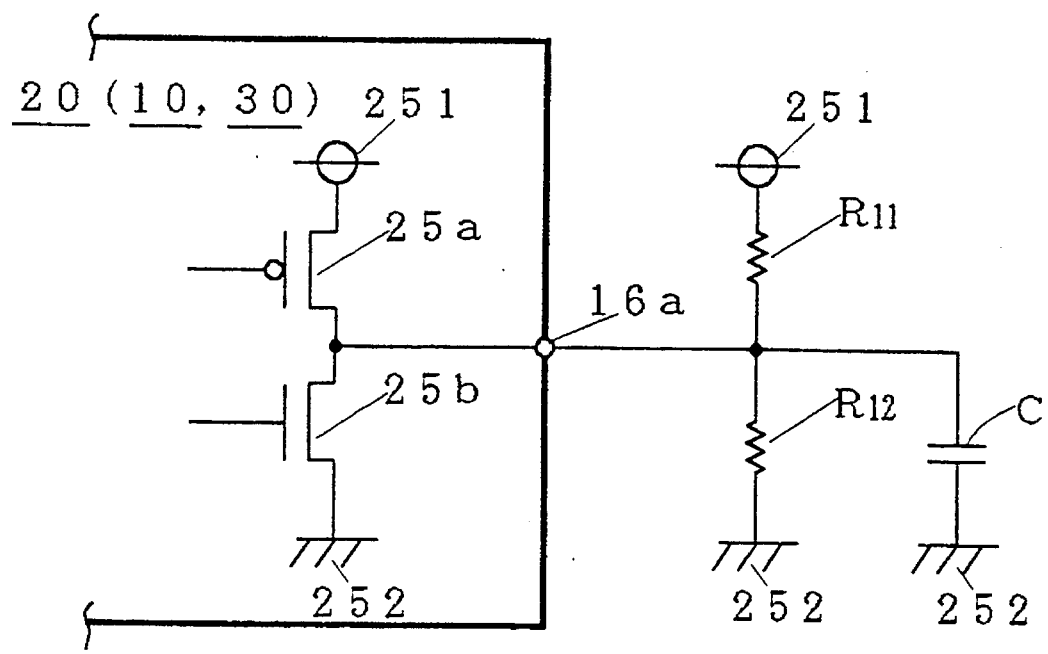
FIGS. 9 to 12 are circuit diagrams showing operations of the third preferred embodiment according to the present invention.

FIG. 9 is a circuit diagram showing connection about the test result output terminal 16a when whether the A-D converters 12a, 12b, 12c are defective or non-defective is judged, that is, when the state of the test result output terminal 16a is measured. The semiconductor integrated circuit 20 (or 10, 30) is shown on the left-handed side of the test result output terminal 16a, and a measuring system for measuring the state of the test result output terminal 16a is shown on the right-handed side thereof. The measuring system is shown in the form of an equivalent circuit and includes a load capacitor C and resistors $R_{11}$, $R_{12}$. The resistors $R_{11}$ and $R_{12}$ are connected in series between the high potential point 251 and the low potential point 252, and the load capacitor C is connected in parallel with the resistor $R_{12}$. The resistances of the resistors $R_{11}$ and $R_{12}$ are selected to be so high that the on-resistances $R_a$ and $R_b$ of the transistors 25a and 25b are neglected.

Figure 10:
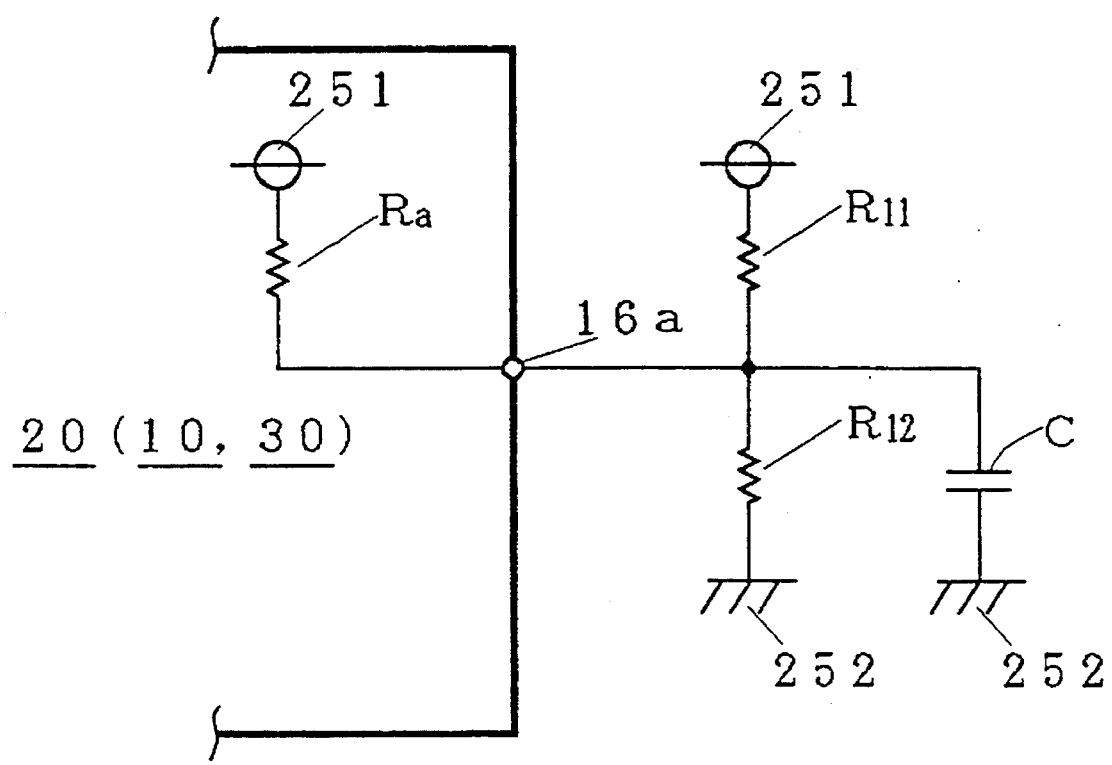

FIG. 10 is a circuit diagram where the transistor 25a is on and the transistor 25b is off. This corresponds to the case where all of the digital signals $D_{1a}$, $D_{1b}$, $D_{1c}$ are "H". In this case, the test result output terminal 16a is connected to the high potential point 251 through the on-resistance $R_a$ of the transistor 25a. The transistor 25b is off with the drain thereof substantially insulated, and is not shown in FIG. 10.

The test result output terminal 16a is connected to the high potential point 251 through the resistors $R_a$ and $R_{11}$ connected in parallel and is connected to the low potential point 252 through the resistor $R_{12}$. The potential at the test result output terminal 16a is expressed as:

$$V_{16a} = \frac{R_{12}}{R_a \| R_{11} + R_{12}} \cdot VDD \tag{1}$$

where the potential at the high potential point 251 is VDD and the potential at the low potential point 255 is zero. Since the resistances of the resistors $R_{11}$ and $R_{12}$ are selected to be so high that the on-resistance $R_a$ of the transistor 25a is neglected as above described, Expression (1) is changed into $$V_{16} \approx \frac{R_{12}}{R_a + R_{12}} \cdot VDD = VDD \tag{2}$$

Then the test result output terminal 16a at "H" is detected.

Figure 11:
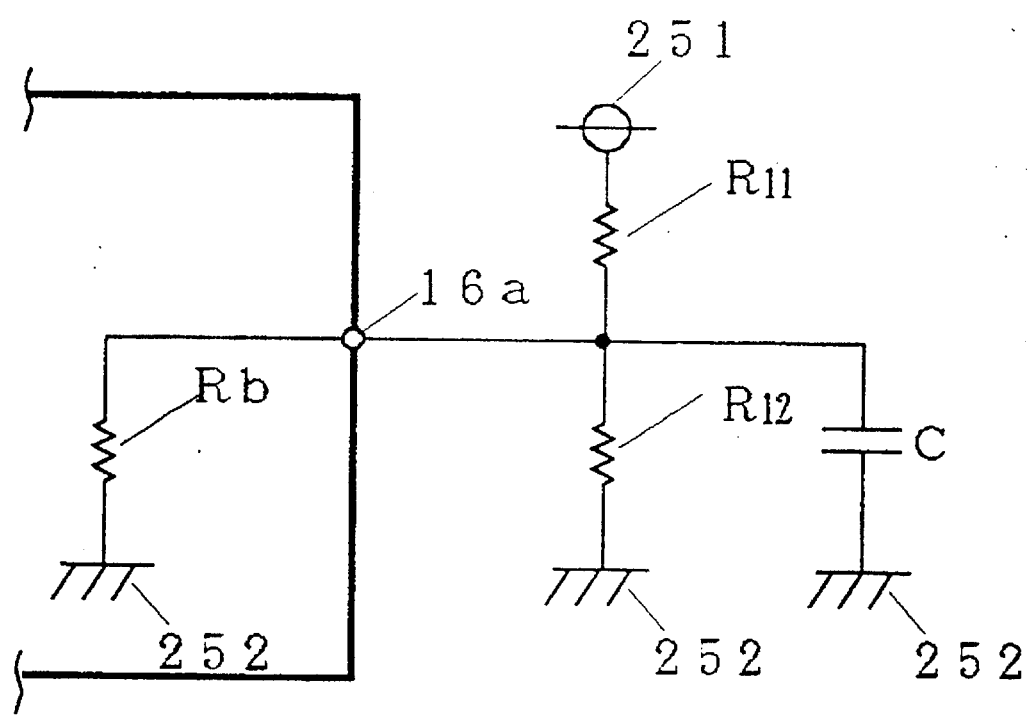

FIG. 11 is a circuit diagram where the transistor 25b is on and the transistor 25a is off. This corresponds to the case where all of the digital signals $D_{1a}$, $D_{1b}$, $D_{1c}$ are "L". The test result output terminal 16a is connected to the low potential point 252 through the on-resistance $R_b$ of the transistor 25b. The transistor 25a is off with the drain thereof substantially insulated and is not shown in FIG. 11.

The test result output terminal 16a is connected to the low potential point 252 through the resistors $R_b$ and $R_{12}$ connected in parallel and is connected to the high potential point 251 through the resistor $R_{11}$. The potential at the test result output terminal 16a is expressed as:

$$V_{16b} = \frac{R_b \| R_{12}}{R_{11} + R_b \| R_{12}} \cdot VDD \tag{3}$$

Since the resistances of the resistors $R_{11}$ and $R_{12}$ are selected to be so high that the on-resistance $R_b$ of the transistor 25b is neglected as above described, Expression (3) is changed into $$V_{16b} \approx \frac{R_b}{R_{11} + R_b} \cdot VDD \approx 0 \tag{4}$$

Then the test result output terminal 16a at "L" is detected.

Figure 12:
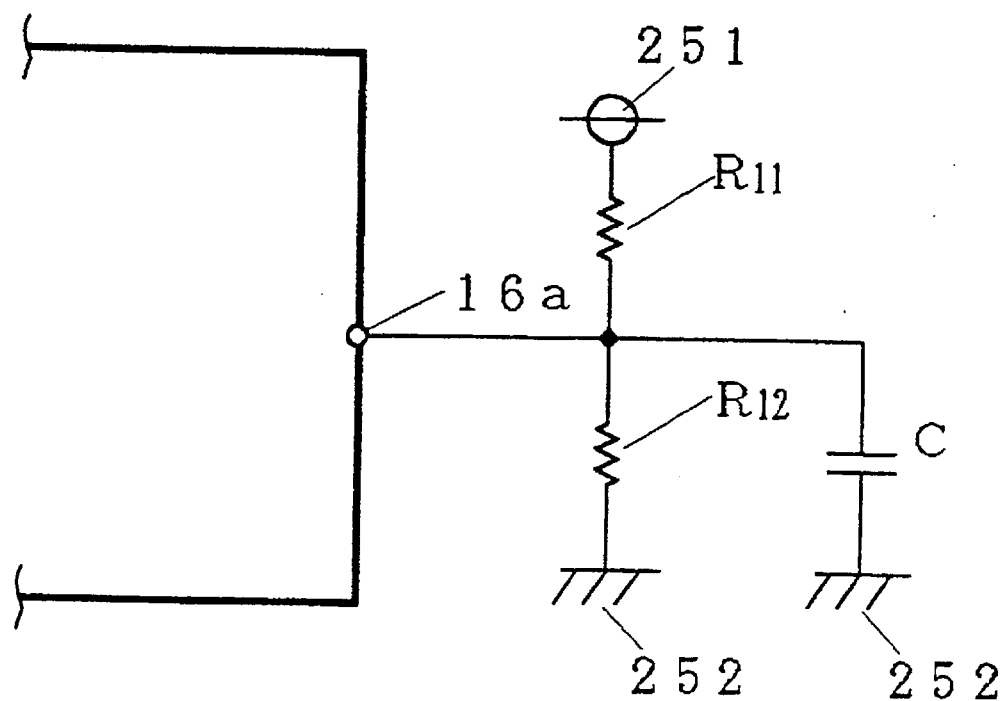

FIG. 12 is a circuit diagram where the transistors 25a and 25b are both off. This corresponds to the case where one or some of the digital signals $D_{1a}$, $D_{1b}$, $D_{1c}$ are "H" and the other or others are "L". The test result output terminal 16a is connected to the high potential point 251 and the low potential point 252 through the resistors $R_{11}$ and $R_{12}$ of the measuring system, respectively. The transistors 25a and 25b are off, with the drains thereof substantially insulated, and are not shown in FIG. 12.

The potential at the test result output terminal 16a is expressed as:

$$V_{16b} = \frac{R_{12}}{R_{11} + R_{12}} \cdot VDD \tag{5}$$

An intermediate potential between the high potential point 251 and the low potential point 252 is detected. For example, assuming $R_{11} = R_{12}$, Expression (5) is changed into $$V_{16b} = 1/2 \cdot VDD \tag{6}$$

Then the test result output terminal 16a at "Z" is detected.

E. Fourth Preferred Embodiment

It is appreciated from the description in the previous section "D. Measurement of High-Impedance State" that, to detect the high-impedance state in the first to third preferred embodiments, it is necessary to use the measuring system having the high potential point 251 and the low potential point 252 to measure the potential at the test result output terminal 16a. In a fourth preferred embodiment will be discussed a test which does not require such an exterior measuring system by improvement in the output portion 25.

Figure 13:
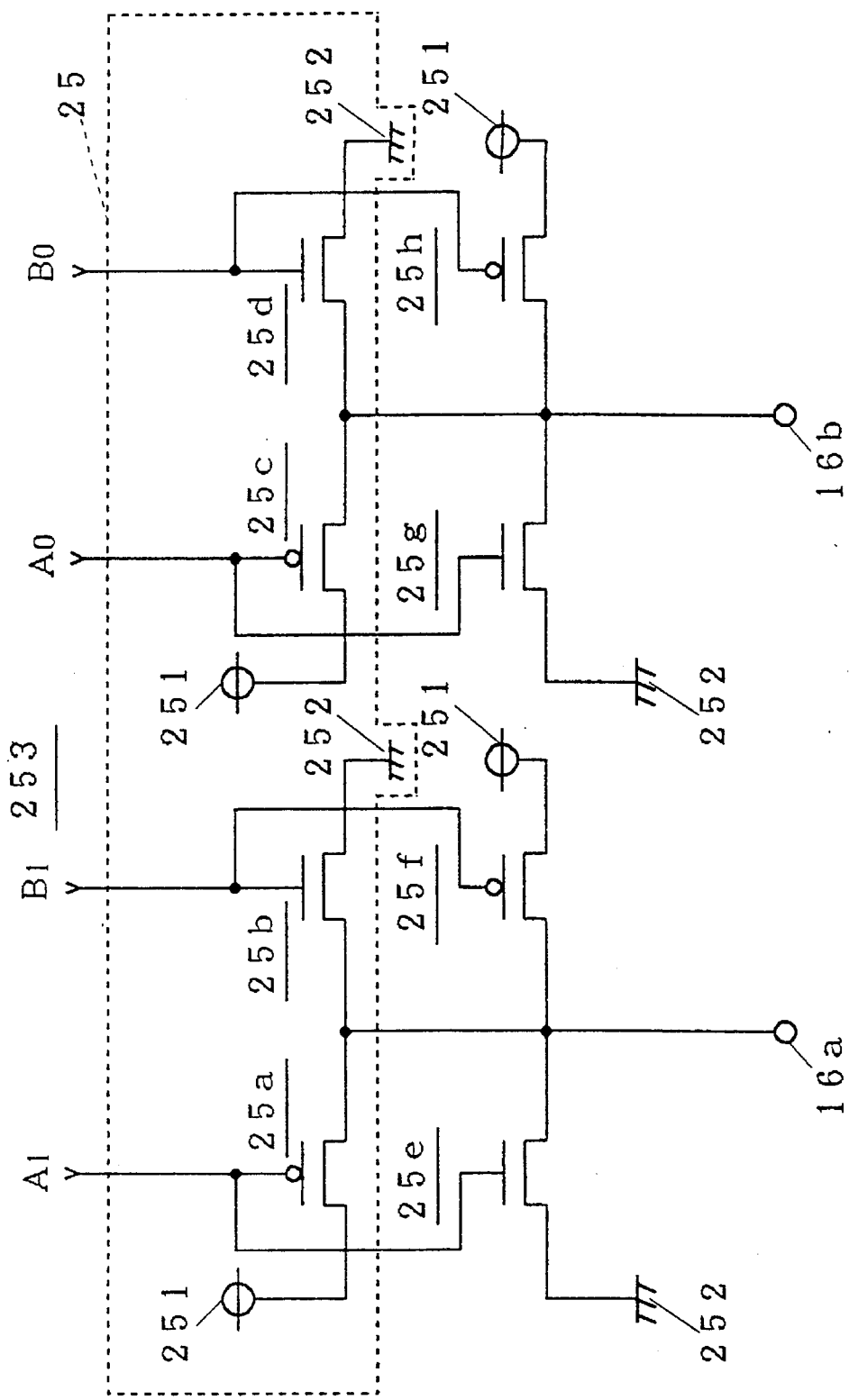
FIG. 13 is a circuit diagram showing a construction of a fourth preferred embodiment according to the present invention.

FIG. 13 is a circuit diagram showing the construction of an output portion 253 according to the fourth preferred embodiment. The output portion 253 may be substituted for the output portion 25 of the second preferred embodiment shown in FIG. 5 and for the output portion 25 of the third preferred embodiment shown in FIG. 8.

The output portion 253 includes NMOS transistors 25e, 25g and PMOS transistors 25f, 25h in addition to the components of the output portion 25. The gate of the transistor 25e is connected to the gate of the transistor 25a and receives the coincidence detection signal $A_1$. The gate of the transistor 25f is connected to the gate of the transistor 25b and receives the coincidence detection signal $B_1$. The source of the transistor 25f is connected to the high potential point 251, and the source of the transistor 25e is connected to the low potential point 252. The drains of the transistor 25*e* and 25*f* and the drains of the transistors 25*a*, 25*b* are commonly connected to the test result output terminal 16*a*.

Likewise, the gate of the transistor 25*g* is connected to the gate of the transistor 25*c* and receives the coincidence detection signal $A_0$. The gate of the transistor 25*h* is connected to the gate of the transistor 25*d* and receives the coincidence detection signal $B_0$. The source of the transistor 25*h* is connected to the high potential point 251, and the source of the transistor 25*g* is connected to the low potential point 252. The drains of the transistors 25*g*, 25*h* and the drains of the transistors 25*c*, 25*d* are commonly connected to the test result output terminal 16*b*.

It is assumed that all of the A-D converters 12*a*, 12*b*, 12*c* correctly provide the high-order bits $D_{1a}$, $D_{1b}$, $D_{1c}$ of the digital signals. If all of the three bits are equally "H", the pair of coincidence detection signals ($A_1$, $B_1$) are ("L", "L"). In this case, the transistors 25*a*, 25*f* are on, and the transistors 25*b*, 25*e* are off. Thus, the test result output terminal 16*a* is connected to the high potential point 251 through the on-resistances of the transistors 25*a*, 25*f* connected in parallel, and the state of the test result output terminal 16*a* is "H".

If all of the three high-order bits $D_{1a}$, $D_{1b}$, $D_{1c}$ of the digital signals are equally "L", the pair of coincidence detection signals ($A_1$, $B_1$) are ("H", "H"). In this case, the transistors 25*b*, 25*e* are on, and the transistors 25*a*, 25*f* are off. Thus, the test result output terminal 16*a* is connected to the low potential point 252 through the on-resistances of the transistors 25*b*, 25*e* connected in parallel, and the state of the test result output terminal 16*a* is "L".

If one or some of the A-D converters 12*a*, 12*b*, 12*c* are in abnormal operation and the three high-order bits $D_{1a}$, $D_{1b}$, $D_{1c}$ of the digital signals do not coincide, the pair of coincidence detection signals ($A_1$, $B_1$) are ("H", "L"). In this case, the transistors 25*e*, 25*f* are on, and the transistors 25*a*, 25*b* are off. Thus, the test result output terminal 16*a* is connected to the low potential point 252 and the high potential point 251 through the on-resistances of the transistors 25*e* and 25*f*, respectively. The intermediate potential between the potential corresponding to "H" and the potential corresponding to "L" is applied to the test result output terminal 16*a*.

The same is true for the test result output terminal 16*b*. If the three low-order bits $D_{0a}$, $D_{0b}$, $D_{0c}$ of the digital signals are equally "H", the test result output terminal 16*b* is connected to the high potential point 251 through the on-resistances of the transistors 25*c*, 25*h* connected in parallel, and the state of the test result output terminal 16*b* is "H". If the three low-order bits $D_{0a}$, $D_{0b}$, $D_{0c}$ of the digital signals are equally "L", the test result output terminal 16*b* is connected to the low potential point 252 through the on-resistances of the transistors 25*g*, 25*d* connected in parallel, and the state thereof is "L". If one or some of the A-D converters 12*a*, 12*b*, 12*c* are in abnormal operation and the three low-order bits $D_{0a}$, $D_{0b}$, $D_{0c}$ of the digital signals do not coincide, the test result output terminal 16*b* is connected to the low potential point 252 and the high potential point 251 through the on-resistances of the transistors 25*g* and 25*h*, respectively. The intermediate potential is applied to the test result output terminal 16*b*.

The fourth preferred embodiment can judge whether the A-D converters 12*a*, 12*b*, 12*c* are defective or non-defective by measuring the potentials at the test result output terminals 16*a*, 16*b* without using the exterior measuring system having the resistors $R_{11}$ and $R_{12}$ shown in FIG. 9.

F. Fifth Preferred Embodiment

In a fifth preferred embodiment will be described a test which does not require the exterior measuring system discussed in Section "D. Measurement of High-Impedance State" by improvement in the output portion 15 of the first preferred embodiment.

Figure 14:
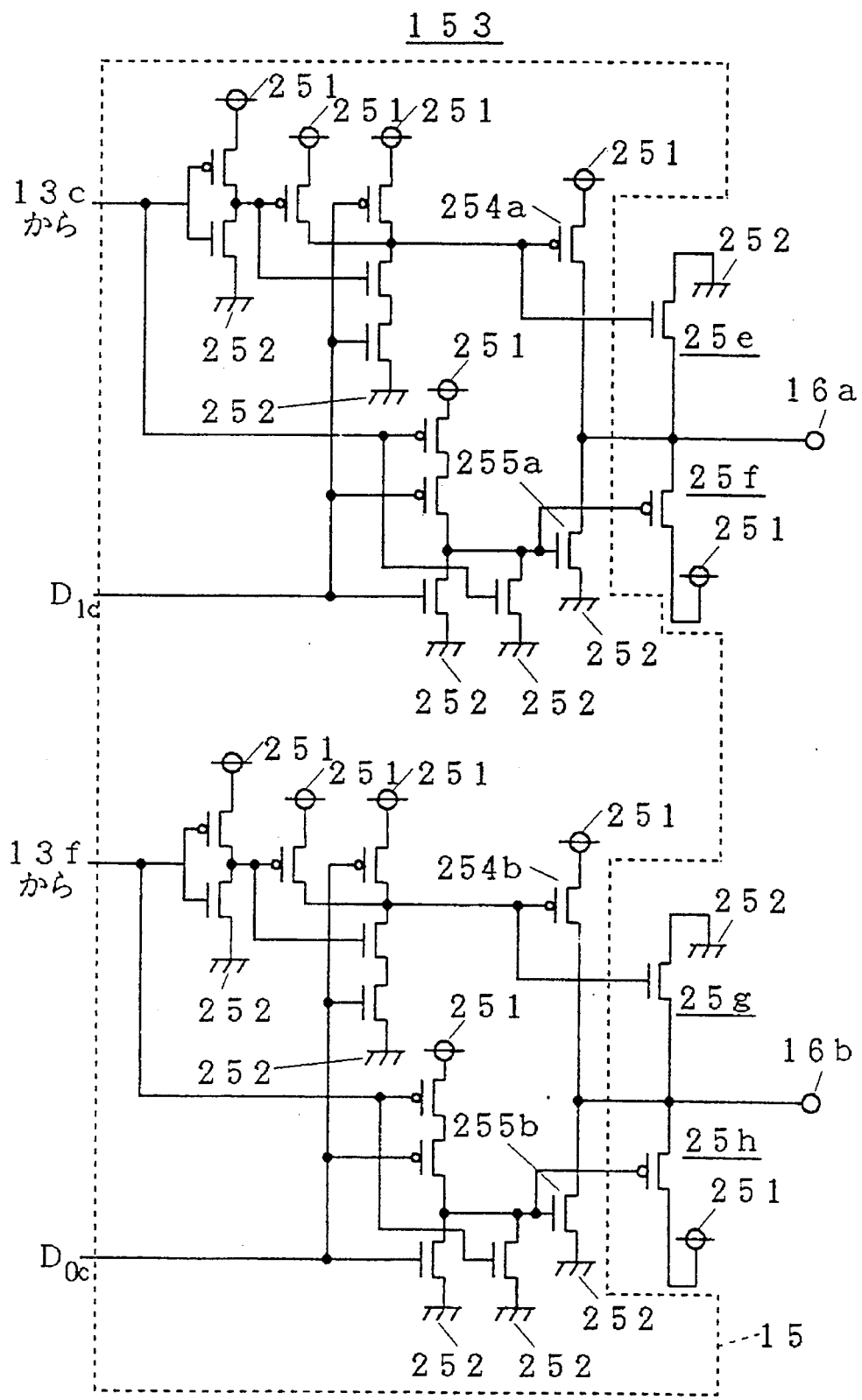
FIG. 14 is a circuit diagram showing a construction of a fifth preferred embodiment according to the present invention.

FIG. 14 is a circuit diagram showing the construction of an output portion 153 according to the fifth preferred embodiment. The output portion 153 may be substituted for he output portion 15 of the first preferred embodiment shown in FIG. 1.

The output portion 153 includes the NMOS transistors 25*e*, 25*g* and the PMOS transistors 25*f*, 25*h* in addition to the components of the output portion 15. The output portion 15 is developed as shown in FIG. 14 with reference to FIG. 4. Transistors 254*a*, 254*b* shown in FIG. 14 function in corresponding relation to the transistor 254 of FIG. 4, and transistors 255*a*, 255*b* shown in FIG. 14 function in corresponding relation to the transistor 255 of FIG. 4.

The gate of the transistor 25*e* is connected to the gate of the transistor 254*a*, and the gate of the transistor 25*f* is connected to the gate of the transistor 255*a*. The source of the transistor 25*f* is connected to the high potential point 251, and the source of the transistor 25*e* is connected to the low potential point 252. The drains of the transistors 25*e*, 25*f* and the drains of the transistors 254*a*, 255*a* are commonly connected to the test result output terminal 16*a*.

Similarly, the gate of the transistor 25*g* is connected to the gate of the transistor 254*b*, and the gate of the transistor 25*h* is connected to the gate of the transistor 255*b*. The source of the transistor 25*h* is connected to the high potential point 251, and the source of the transistor 25*g* is connected to the low potential point 252. The drains of the transistors 25*g*, 25*h* and the drains of the transistors 254*b*, 255*b* are commonly connected to the test result output terminal 16*b*.

It is assumed that all of the A-D converters 12*a*, 12*b*, 12*c* correctly provide the high-order bits $D_{1a}$, $D_{1b}$, $D_{1c}$ of the digital signals. If all of the three high-order bits are equally "H", the output of the OR gate 13*c* shown in FIG. 1 is "L", the transistors 254*a* and 25*f* being on, the transistors 255*a*, 25*e* being off. The test result output terminal 16*a* is connected to the high potential point 251 through the on-resistances of the transistors 254*a*, 25*f* connected in parallel, and the state of the test result output terminal 16*a* is "H".

If all of the three high-order bits $D_{1a}$, $D_{1b}$, $D_{1c}$ of the digital signals are equally "L", the output of the OR gate 13*c* shown in FIG. 1 is "L", the transistors 255*a* and 25*e* being on, the transistors 254*a*, 25*f* being off. The test result output terminal 16*a* is connected to the low potential point 252 through the on-resistances of the transistors 255*a*, 25*e* connected in parallel, and the state of the test result output terminal 16*a* is "L".

If one or some of the A-D converters 12*a*, 12*b*, 12*c* are in abnormal operation and the three high-order bits $D_{1a}$, $D_{1b}$, $D_{1c}$ of the digital signals do not coincide, the output of the OR gate 13*c* of FIG. 1 is "H". The transistors 25*e*, 25*f* are on and the transistors 254*a*, 255*a* are off. The test result output terminal 16*a* is connected to the low potential point 252 and the high potential point 251 through the on-resistances of the transistors 25*e* and 25*f*, respectively. The intermediate potential between the potential corresponding to "H" and the potential corresponding to "L" is applied to the test result output terminal 16*a*.

The same is true for the test result output terminal 16*b*. If all of the low-order bits $D_{0a}$, $D_{0b}$, $D_{0c}$ of the digital signals are equally "H", the test result output terminal 16*b* is connected to the high potential point 251 through the on-resistances of the transistors 254*b*, 25*h* connected in parallel, and the state of the test result output terminal 16*b* is "H". If all of the three low-order bits $D_{0a}$, $D_{0b}$, $D_{0c}$ of the digital signals are equally "L", the test result output terminal 16*b* is connected to the low potential point 252 through the on-resistances of the transistors 25*g*, 255*b* connected in parallel, and the state of the test result output terminal 16*b* is "L". If one or some of the A-D converters 12*a*, 12*b*, 12*c* are in abnormal operation and the three low-order bits $D_{0a}$, $D_{0b}$, $D_{0c}$ of the digital signals do not coincide, the test result output terminal 16*b* is connected to the low potential point 252 and the high potential point 251 through the on-resistances of the transistors 25*g* and 25*h*, respectively. The intermediate potential is applied to the test result output terminal 16*b*.

The fifth preferred embodiment, similar to the fourth preferred embodiment, can judge whether the A-D converters 12*a*, 12*b*, 12*c* are defective or non-defective by measuring the potentials at the test result output terminals 16*a*, 16*b* without using the exterior measuring system having the resistors $R_{11}$, $R_{12}$ shown in FIG. 9.

G. Sixth Preferred Embodiment

In the fourth and fifth preferred embodiment, when the output portions 253, 153 output the intermediate potential, a through current flows in the pair of transistors 25*e*, 25*f* or the pair of transistors 25*g*, 25*h*, resulting in a large amount of power consumption of the semiconductor integrated circuit containing the transistors. A sixth preferred embodiment is designed to suppress power consumption and provide the effects of the fourth and fifth preferred embodiments.

Figure 15:
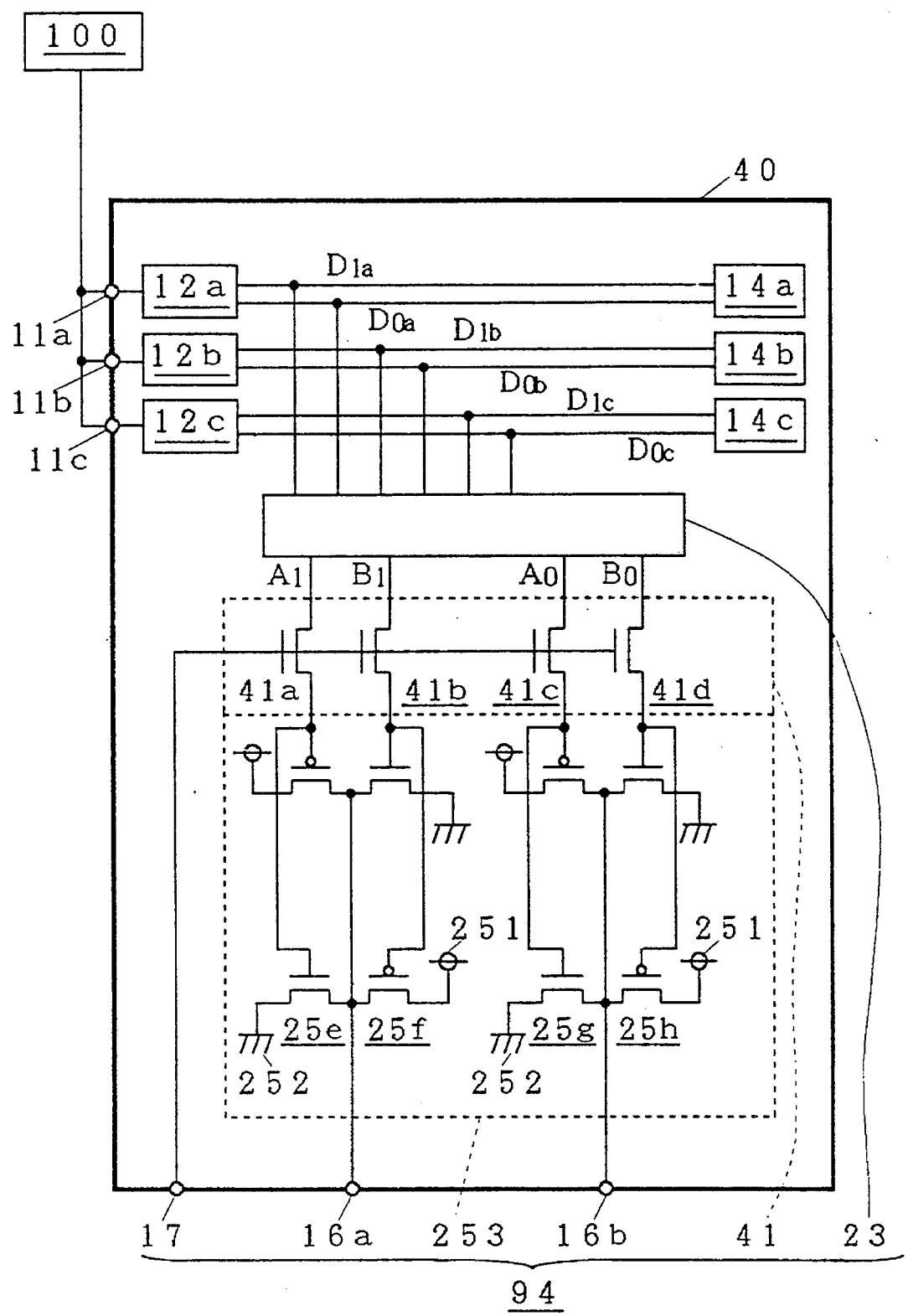
FIGS. 15 and 16 are circuit diagrams showing a construction of a sixth preferred embodiment according to the present invention.

FIG. 15 is a circuit diagram showing the construction of a semiconductor integrated circuit 40 including an A-D converter testing circuit 94 according to the sixth preferred embodiment of the present invention. The semiconductor integrated circuit 40 is constructed such that the A-D converter testing circuit 94 is substituted for the A-D converter testing circuit 92 of the semiconductor integrated circuit 20. The A-D converter testing circuit 94 includes the output portion 253 substituted for the output portion 25 of the A-D converter testing circuit 92, a mode terminal 17, and a switching portion 41 between the coincidence detecting circuit 23 and the output portion 253.

The switching portion 41 includes NMOS transistors 41*a*, 41*b*, 41*c*, 41*d* having sources receiving the coincidence detection signals $A_1$, $B_1$, $A_0$, $B_0$, and drains connected to the gates of the transistors 25*e*, 25*f*, 25*g*, 25*h* of the output portion 253, respectively. The mode terminal 17 is connected to the gates of the transistors 41*a*, 41*b*, 41*c*, 41*d*. Unless a potential corresponding to "H" is applied to the mode terminal 17 from the exterior of the semiconductor integrated circuit 40, the transistors 41*a*, 41*b*, 41*c*, 41*d* are not conductive, and the gates of the transistors 25*e*, 25*f*, 25*g*, 25*h* are floating. By applying the potential corresponding to "H" to the mode terminal 17 from the exterior only when whether the A-D converters 12*a*, 12*b*, 12*c* are defective or non-defective is tested, power consumption due to the through current flowing in the pair of transistors 25*e*, 25*f* or the pair of transistors 25*g*, 25*h* is alleviated.

Therefore, the six preferred embodiment provides the effects of alleviating power consumption in addition to the effects of the fourth preferred embodiment.

Figure 16:
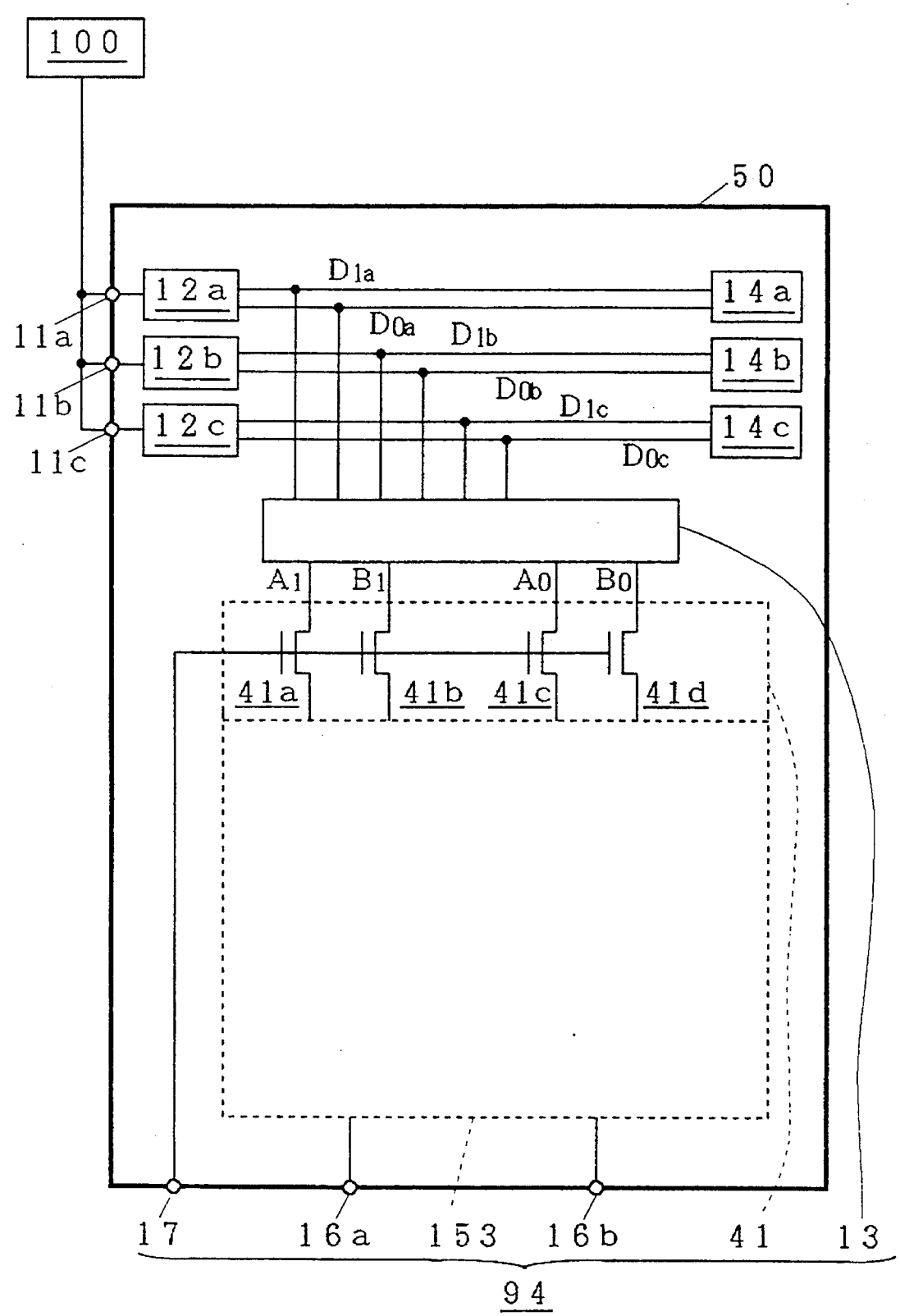

It will be easily inferred to apply the switching portion 41 to the fifth preferred embodiment. FIG. 16 is a circuit diagram showing the construction of a semiconductor integrated circuit 50 including an A-D converter testing circuit 95. The semiconductor integrated circuit 50 is constructed such that the A-D converter testing circuit 95 is substituted for the A-D converter testing circuit 91 of the semiconductor integrated circuit 10. The A-D converter testing circuit 95 includes the output portion 153 substituted for the output portion 15 of the A-D converter testing circuit 91, the mode terminal 17, and the switching circuit 41 between the coincidence detecting circuit 13 and the output portion 153.

In such a construction, the power consumption due to the through current is alleviated by applying the potential corresponding to "H" to the mode terminal 17 from the exterior only when whether the A-D converters 12*a*, 12*b*, 12*c* are defective or non-defective is tested.

The sixth preferred embodiment provides the effect of alleviating the power consumption in addition to the effects of the fifth preferred embodiment.

H. Seventh Preferred Embodiment

Figure 17:
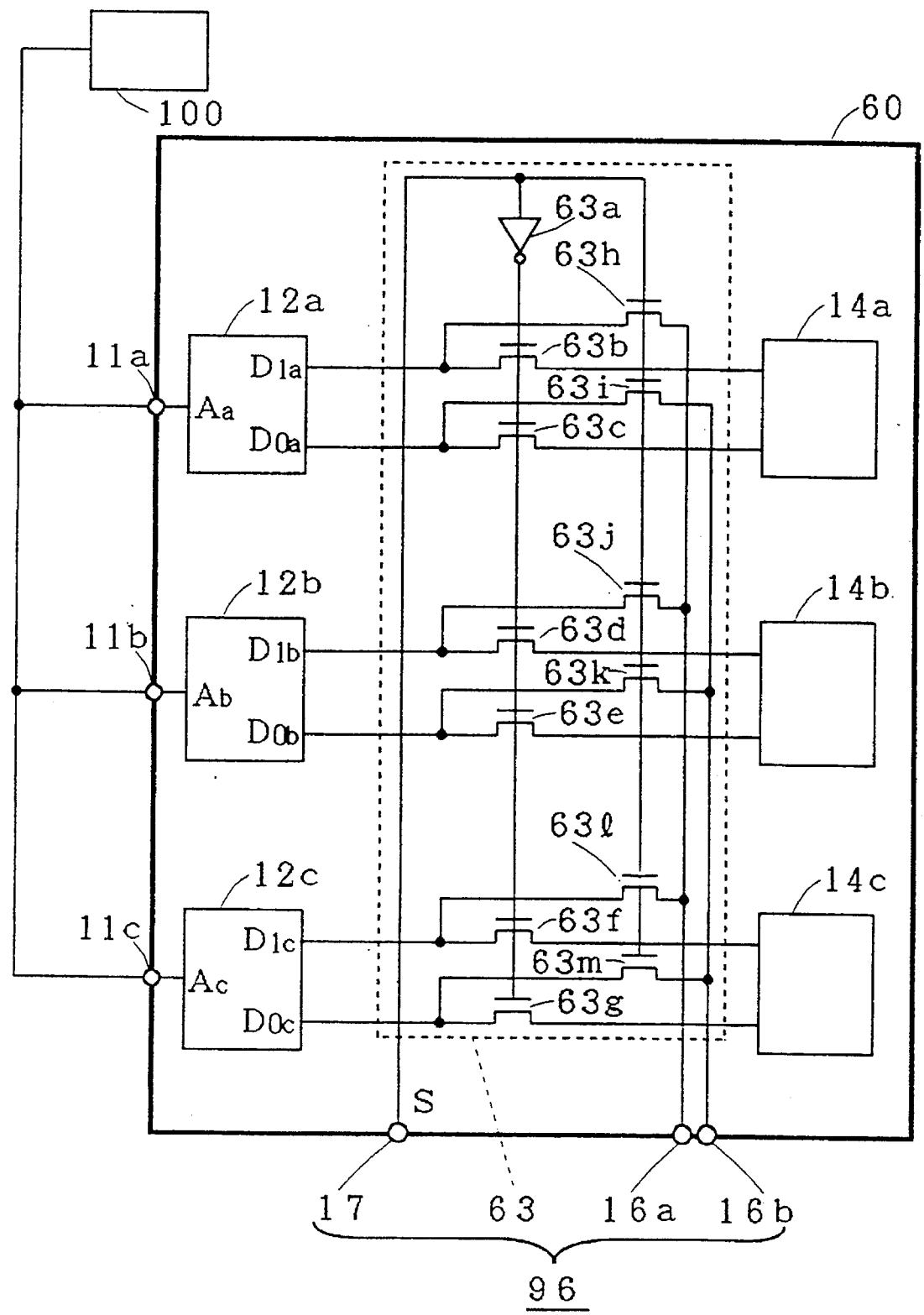
FIG. 17 is a circuit diagram showing a construction of a seventh preferred embodiment according to the present invention.

FIG. 17 is a circuit diagram showing the construction of a semiconductor integrated circuit 60 including an A-D converter testing circuit 96 according to a seventh preferred embodiment of the present invention. The semiconductor integrated circuit 60, similar to the semiconductor integrated circuit 10 of the first preferred embodiment, comprises the analog input terminals 11*a*, 11*b*, 11*c*, the A-D converters 12*a*, 12*b*, 12*c* corresponding to the analog input terminals 11*a*, 11*b*, 11*c*, and the digital signal processing circuits 14*a*, 14*b*, 14*c* corresponding thereto. The A-D converter testing circuit 96 is connected to the A-D converters 12*a*, 12*b*, 12*c* but is not parallel with the digital signal processing circuits 14*a*, 14*b*, 14*c* unlike the first preferred embodiment.

The A-D converter testing circuit 96 includes a coincidence detecting circuit 63, the test result output terminals 16*a*, 16*b*, and the mode terminal 17.

The coincidence detecting circuit 63 includes one inverter 63*a* and twelve NMOS transistors 63*b* to 63*m*. The drains of the transistors 63*b*, 63*c*, 63*d*, 63*e*, 63*f*, 63*g* receive the high-order bit $D_{1a}$ of the output of the A-D converter 12*a*, the low-order bit $D_{0a}$ of the output of the A-D converter 12*a*, the high-order bit $D_{1b}$ of the output of the A-D converter 12*b*, the low-order bit $D_{0b}$ of the output of the A-D converter 12*b*, the high-order bit $D_{1c}$ of the output of the A-D converter 12*c*, the low-order bit $D_{0c}$ of the output of the A-D converter 12*c*, respectively. Likewise, the drains of the transistors 63*h*, 63*i*, 63*j*, 63*k*, 63*l*, 63*m* receive the high-order bit $D_{1a}$ of the output of the A-D converter 12*a*, the low-order bit $D_{0a}$ of the output of the A-D converter 12*a*, the high-order bit $D_{1b}$ of the output of the A-D converter 12*b*, the low-order bit $D_{0b}$ of the output of the A-D converter 12*b*, the high-order bit $D_{1c}$ of the output of the A-D converter 12*c*, the low-order bit $D_{0c}$ of the output of the A-D converter 12*c*, respectively.

The sources of the transistors 63*b*, 63*c* are connected to the digital signal processing circuit 14*a*. The sources of the transistors 63*d*, 63*e* are connected to the digital signal processing circuit 14*b*. The sources of the transistors 63*f*, 63*g* are connected to the digital signal processing circuit 14*c*. The sources of the transistors 63*h*, 63*j*, 63*l* are commonly connected to the test result output terminal 16*a*, and the sources of the transistors 63*i*, 63*k*, 63*m* are commonly connected to the test result output terminal 16*b*.

A selection signal S is applied to the mode terminal 17. The selection signal S is applied to the gates of the transistors 63*h*, 63*i*, 63*j*, 63*k*, 63*l*, 63*m*. The inverse of the selection signal S which is provided by the inverter 63*a* is applied to the gates of the transistors 63*b*, 63*c*, 63*d*, 63*e*, 63*f*, 63*g*.

When the selection signal S is "L", the logic "H" is applied by the inverter 63*a* to the gates of the transistors 63*b*, 63*c*, 63*d*, 63*e*, 63*f*, 63*g*, which then turn on, and the digital signals $D_{1a}D_{0a}$, $D_{1b}D_{0b}$, $D_{1c}D_{0c}$ are applied to the digital signal processing circuits 14*a*, 14*b*, 14*c*, respectively. On the other hand, the logic "L" is applied to the gates of the transistors 63*h*, 63*i*, 63*j*, 63*k*, 63*l*, 63*m*, which then turn off, and the test result output terminals 16a, 16b enter the high-impedance state.

Conversely, when the selection signal S is "H", the logic "L" is applied by the inverter 63a to the gates of the transistors 63b, 63c, 63d, 63e, 63f, 63g, which then turn off. The digital signal processing circuits 14a, 14b, 14c do not receive the digital signals $D_{1a}D_{0a}$, $D_{1b}D_{0b}$, $D_{1c}D_{1c}$. On the other hand, the logic "H" is applied to the gates of the transistors 63h, 63i, 63j, 63k, 63l, 63m, which then turn on. The high-order bits $D_{1a}$, $D_{1b}$, $D_{1c}$ of the outputs of the A-D converters 12a, 12b, 12c are applied to the test result output terminal 16a at a time, and the low-order bits $D_{0a}$, $D_{0b}$, $D_{0c}$ of the outputs of the A-D converters 12a, 12b, 12c are applied to the test result output terminal 16b at a time.

Figure 18:
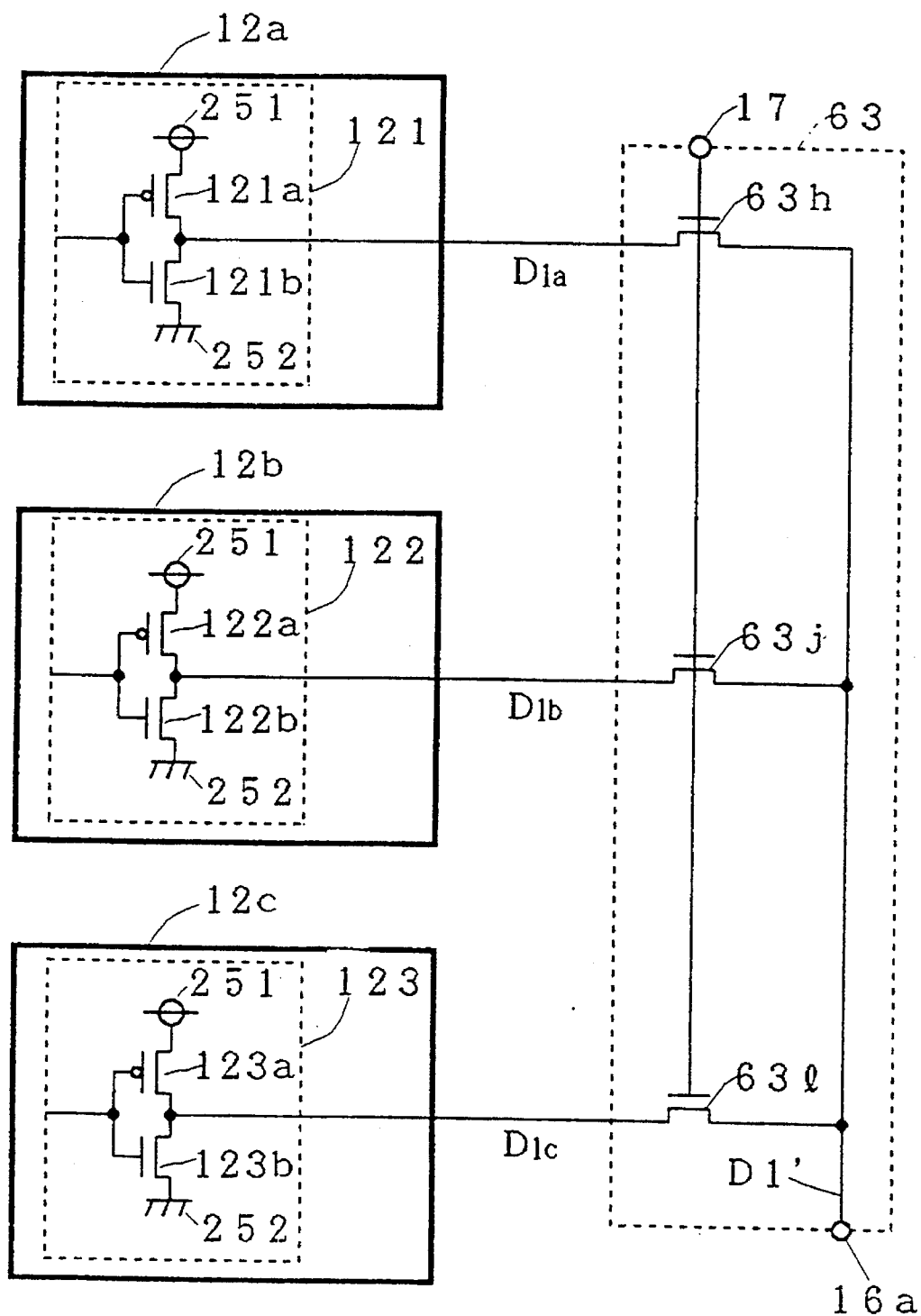
FIGS. 18 to 22 are circuit diagrams showing operations of the seventh preferred embodiment according to the present invention.

FIG. 18 is a circuit diagram equivalently showing the transistors 63h, 63j, 63l and their associated portions when the selection signal S is "H". The transistors 63b, 63c, 63d, 63e, 63f, 63g are off and are not shown in FIG. 18.

The A-D converters 12a, 12b, 12c normally include CMOS inverters 121, 122, 123 at their last stage. The CMOS inverter 121 includes a PMOS transistor 121a and an NMOS transistor 121b which have sources connected to the high potential point 251 and the low potential point 252, respectively, and drains commonly connected to output the digital signal $D_{1a}$. Likewise, the CMOS inverter 122 includes a PMOS transistor 122a and an NMOS transistor 122b which have sources connected to the high potential point 251 and the low potential point 252, respectively, and drains commonly connected to output the digital signal $D_{1b}$. Likewise, the CMOS inverter 123 includes a PMOS transistor 123a and an NMOS transistor 123b which have sources connected to the high potential point 251 and the low potential point 252, respectively, and drains commonly connected to output the digital signal $D_{1c}$.

Figure 19:
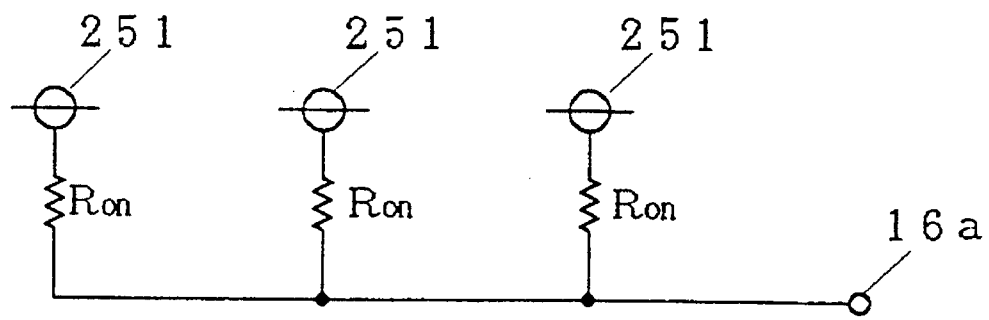

It is assumed that all of the A-D converters 12a, 12b, 12c are in normal operation. In this case, the digital signals $D_{1a}$, $D_{1b}$, $D_{1c}$ coincide with each other. For example, when all of the digital signals $D_{1a}$, $D_{1b}$, $D_{1c}$ are "H", the transistors 121a, 122a, 123a are on and the transistors 121b, 122b, 123b are off. An equivalent circuit of the test result output terminal 16a and its associated portions is shown in FIG. 19 in this case. The sum of the on-resistance of the transistor 121a and the on-resistance of the transistor 63h, the sum of the on-resistance of the transistor 122a and the on-resistance of the transistor 63j, and the sum of the on-resistance of the transistor 123a and the on-resistance of the transistor 63l are assumed to equal and shown in the form of resistors $R_{on}$ in FIG. 19. In such a case, the potential at the test result output terminal 16a equals the potential at the high potential point 251 (corresponding to "H"; herein VDD).

Figure 20:
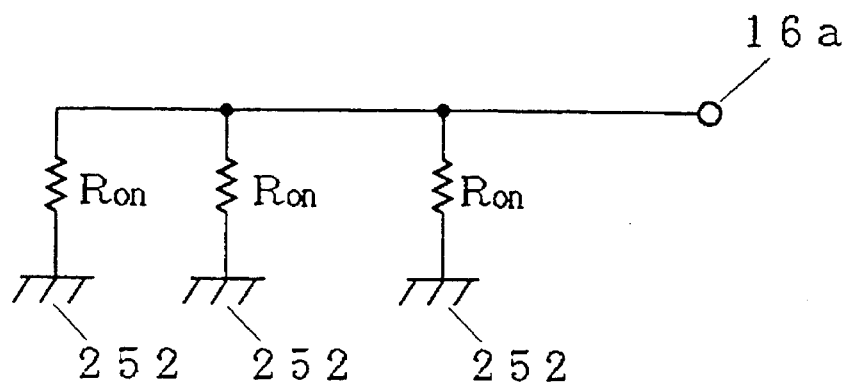

When all of the digital signals $D_{1a}$, $D_{1b}$, $D_{1c}$ are "L", the transistors 121b, 122b, 123b are on and the transistors 121a, 122a, 123a are off. An equivalent circuit of the test result output terminal 16a and its associated portions is shown in FIG. 20 in this case. Assuming that the on-resistances of the transistors 121b, 122b, 123b are equal to the on-resistances of the transistors 121a, 122a, 123a, resistors shown in FIG. 20 are equal to the resistor $R_{on}$. In such a case, the potential at the test result output terminal 16a equals the potential at the low potential point 252 (corresponding to "L"; herein GND=0).

If at least one of the A-D converters 12a, 12b, 12c is abnormal, the potential at the test result output terminal 16a is the intermediate potential between VDD and zero.

Figure 21:
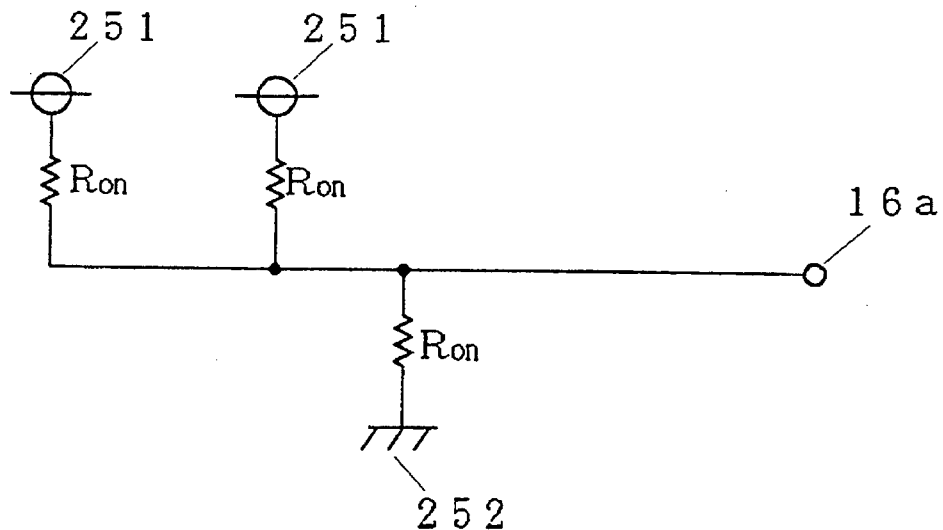

FIG. 21 is a circuit diagram showing the test result output terminal 16a and its associated portions where the digital signals $D_{1a}$ and $D_{1b}$ are "H" and the digital signal $D_{1c}$ is "L". The test result output terminal 16a is connected to the high potential point 251 with two resistors $R_{on}$ connected in parallel and is connected to the low potential point 252 with one resistor $R_{on}$. Then the potential at the test result output terminal 16a is $V_{16a}=2.VDD/3$.

Figure 22:
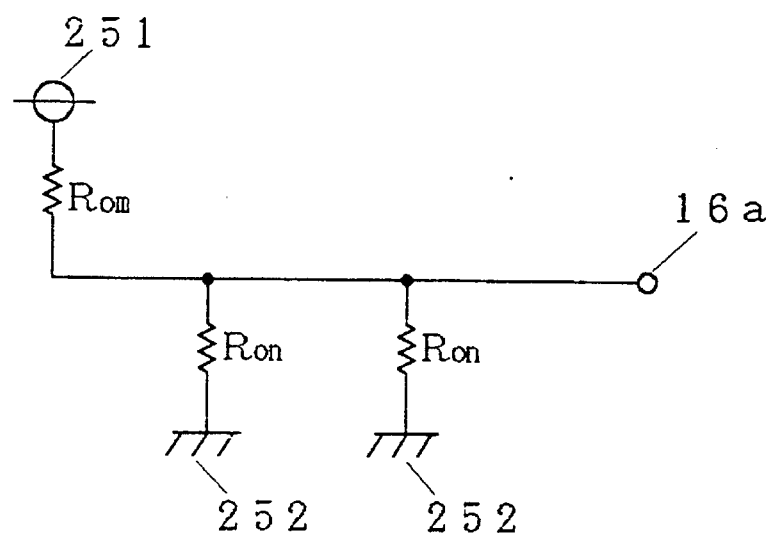

FIG. 22 is a circuit diagram showing the test result output terminal 16a and its associated portions where the digital signals $D_{1a}$ and $D_{1b}$ are "L" and the digital signal $D_{1c}$ is "H". The test result output terminal 16a is connected to the low potential point 252 with two resistors $R_{on}$ connected in parallel and is connected to the high potential point 251 with one resistor $R_{on}$. Then the potential at the test result output terminal 16a is $V_{16a}=VDD/3$.

As hereinabove described, it is found that the high-order bit outputs of the A-D converters 12a, 12b, 12c are normal if the potential measured at the test result output terminal 16a corresponds to either "H" or "L", and it is found that an abnormality is present in the high-order bit outputs of the A-D converters 12a, 12b, 12c if the potential at the test result output terminal 16a is the intermediate potential between the potentials corresponding to "H" and "L". Similarly, whether the low-order bit outputs of the A-D converters 12a, 12b, 12c are normal or not is found by measuring the potential at the test result output terminal 16b.

The seventh preferred embodiment, similar to the sixth preferred embodiment, has the effect of rapidly judging whether the A-D converters are defective or non-defective without increasing power consumption.

I. Eighth Preferred Embodiment (I-1) Basic Concept

Figure 23:
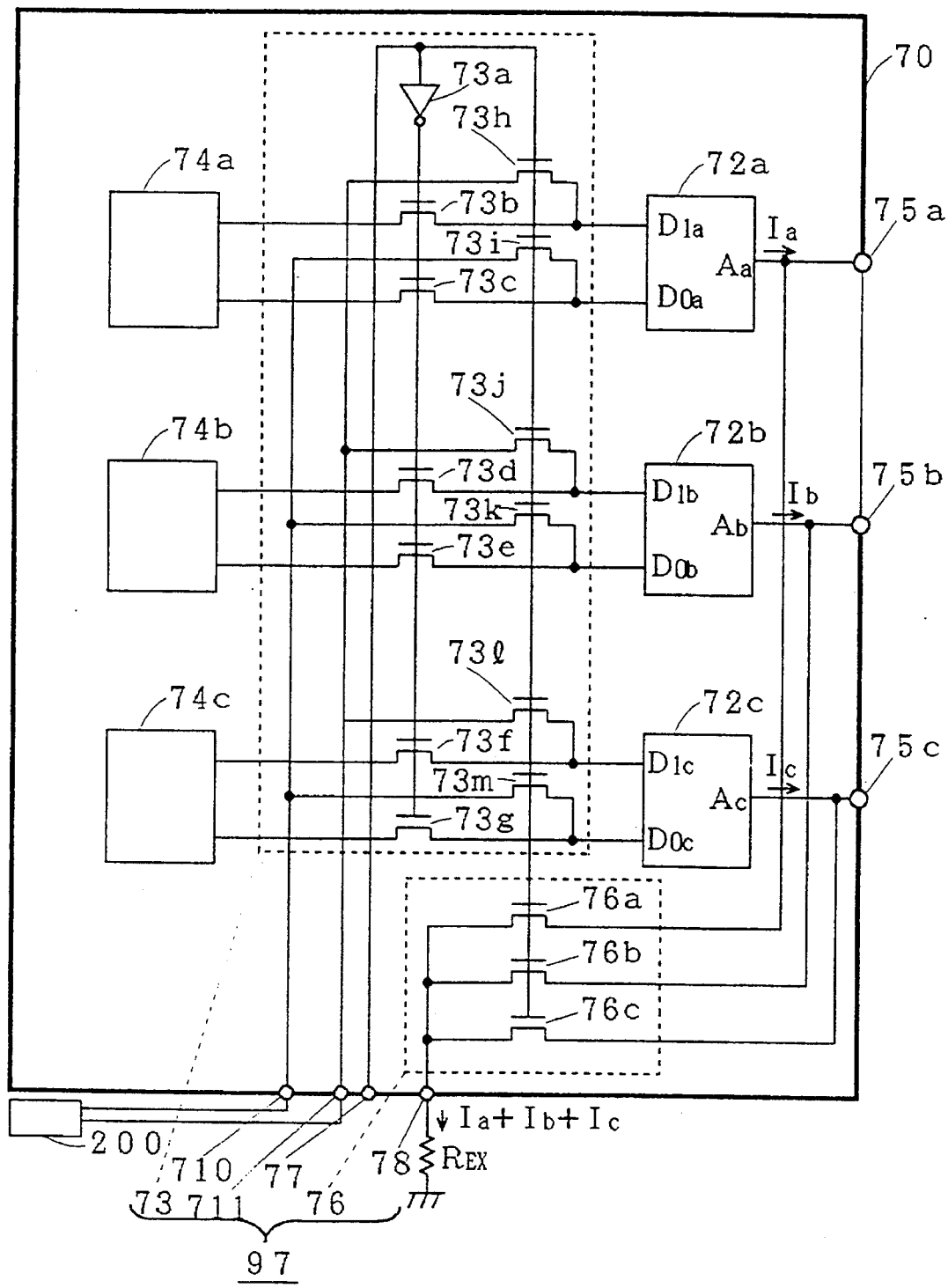
FIG. 23 is a circuit diagram showing a construction of an eighth preferred embodiment according to the present invention.

FIG. 23 is a circuit diagram showing the construction of a semiconductor integrated circuit 70 including a D-A converter testing circuit 97 according to an eighth preferred embodiment of the present invention. The semiconductor integrated circuit 70 comprises 2-bit D-A converters 72a, 72b, 72c, digital signal processing circuits 74a, 74b, 74c corresponding to the D-A converters 72a, 72b, 72c, and the D-A converter testing circuit 97 according to the present invention including test signal input terminals 710, 711, a test signal input circuit 73, an output portion 76, a mode terminal 77, and a test result output terminal 78.

The selection signal S is applied to the mode terminal 77. When the selection signal S is "L", the test signal input circuit 73 transmits signals from the digital sinal processing circuits 74a, 74b, 74c to the D-A converters 72a, 72b, 72c. When the selection signal S is "H", the test signal input circuit 73 transmits test signals applied to the test signal input terminals 710, 711 to the D-A converters 72a, 72b, 72c.

Figure 27:
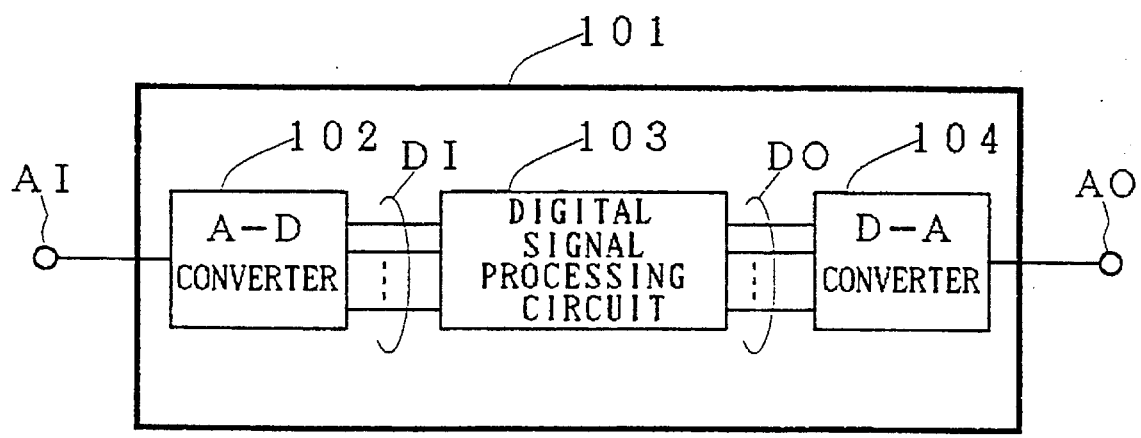
FIGS. 27 to 29 are block diagrams of the background art.
Figure 28:
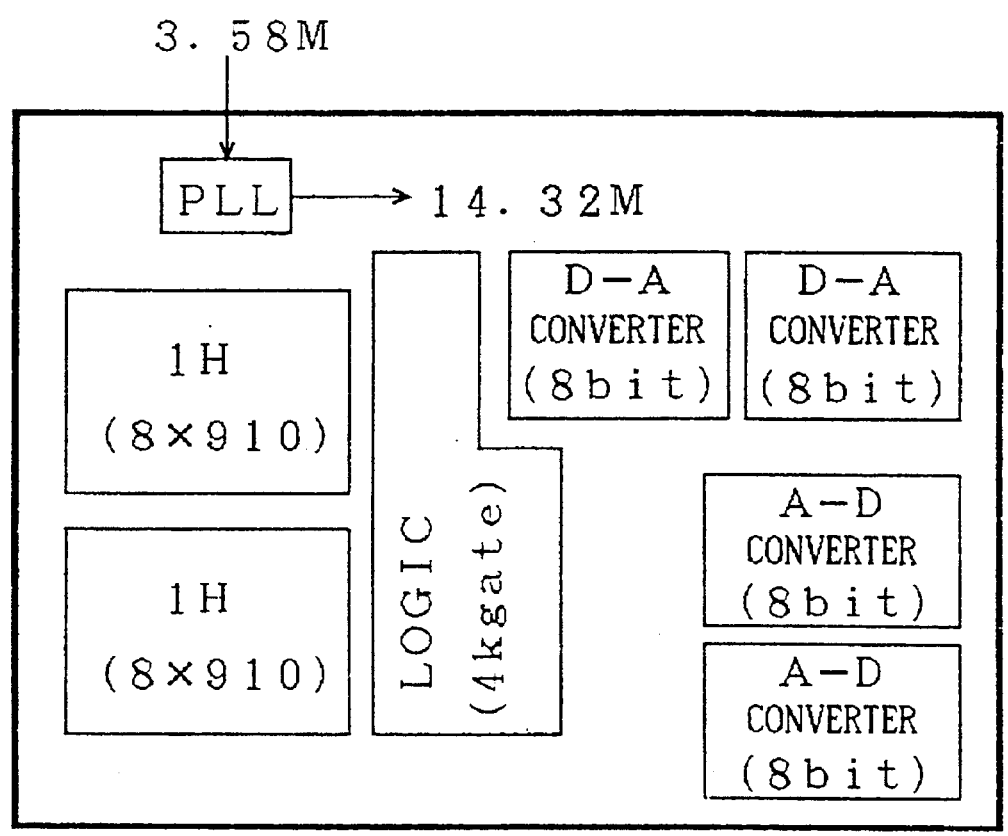
Figure 29:
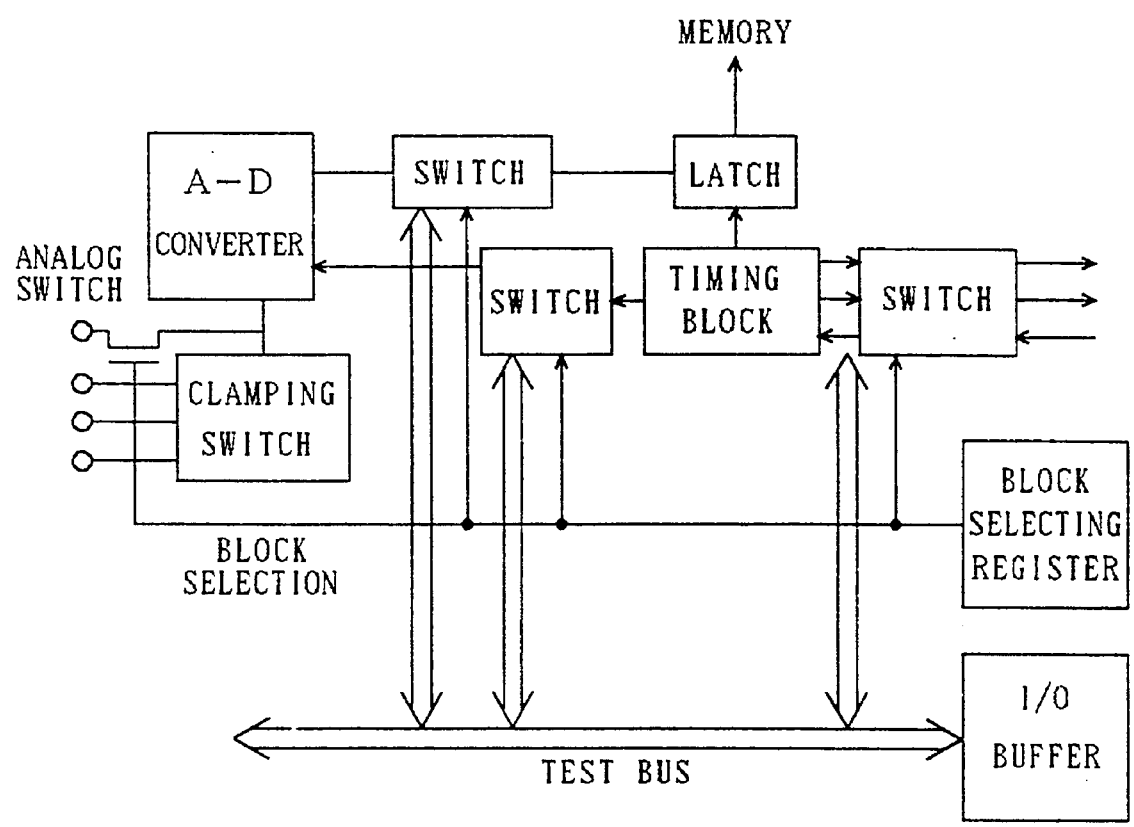

That is, when the selection signal S is "L", the semiconductor integrated circuit 70 operates normally, and relation between the D-A converters 72a, 72b, 72c and the digital signal processing circuits 74a, 74b, 74c in the semiconductor integrated circuit 70 is similar to relation between the D-A converter 104 and the digital signal processing circuit 103 in the signal processing system 101 of the background art shown in FIG. 27. In this case, digital signals applied to the D-A converters 72a, 72b, 72c correspond to the digital signal D0.

On the other hand, when the selection signal S is "H", the semiconductor integrated circuit 70 performs a test operation, in which it is judged whether the D-A converters 72a, 72b, 72c are defective or non-defective. An exterior digital signal generator 200 applies the test signals to the test signal input terminals 710, 711.

The D-A converters 72a, 72b, 72c receive and convert 2-bit digital signals $D_{1a}D_{0a}$, $D_{1b}D_{0b}$, $D_{1c}D_{0c}$ into analog signals $A_a$, $A_b$, $A_c$ which are outputted in the form of currents $I_a$, $I_b$, $I_c$, respectively.

The output portion 76 applies the outputs of the D-A converters 72a, 72b, 72c to the test result output terminal 78 when the selection signal S is "H" (in test operation), but insulates the test result output terminal 78 when the selection signal S is "L" (in normal operation).

The D-A converters 72a, 72b, 72c, if all normal, output equal analog signals $A_a$, $A_b$, $A_c$ in response to the same digital signal. Therefore, whether the D-A converters 72a, 72b, 72c are defective or non-defective is judged by measuring the value of current drawn out of the test result output terminal 78 during the test operation.

(I-2) Test Signal Input Circuit 73

The test signal input circuit 73 includes one inverter 73a and twelve NMOS transistors 73b to 73m.

The drains of the transistors 73b, 73c, 73h, 73i are connected to the D-A converter 72a. The drains of the transistors 73d, 73e, 73j, 73k are connected to the D-A converter 72b. The drains of the transistors 73f, 73g, 73l, 73m are connected to the D-A converter 72c.

The output of the digital signal processing circuit 74a is applied to the sources of the transistors 73b, 73c. The output of the digital signal processing circuit 74b is applied to the sources of the transistors 73d, 73e. The output of the digital signal processing circuit 74c is applied to the sources of the transistors 73f, 73g.

The sources of the transistors 73h, 73j, 73l are connected to the test signal input terminal 711, and the sources of the transistors 73i, 73k, 73m are connected to the test signal input terminal 710.

The selection signal S is impressed upon the gates of the transistors 73h, 73i, 73j, 73k, 73l, 73m. The inverse of the selection signal S which is provided by the inverter 73a is impressed upon the gates of the transistors 73b, 73c, 73d, 73e, 73f, 73g.

When the selection signal S is "L", the logic "H" is applied by the inverter 73a to the gates of the transistors 73b, 73c, 73d, 73e, 73f, 73g, which then turn on, and the outputs from the digital signal processing circuits 74a, 74b, 74c are impressed upon the D-A converters 72a, 72b, 72c. These outputs are provided as the digital signals $D_{1a}D_{0a}$, $D_{1b}D_{0b}$, $D_{1c}D_{0c}$ and are digital-to-analog converted into the analog signals $A_a$, $A_b$, $A_c$ which are transmitted to analog signal output terminals 75a, 75b, 75c, respectively, and to the output portion 76.

Conversely, when the selection signal S is "H", the logic "L" is applied by the inverter 73a to the gates of the transistors 73b, 73c, 73d, 73e, 73f, 73g, which then turn off. The D-A converters 72a, 72b, 72c receive the signals applied to the test input terminal 711 as the digital signals $D_{1a}$, $D_{1b}$, $D_{1c}$ and the signals applied to the test input terminal 710 as the digital signals $D_{0a}$, $D_{0b}$, $D_{0c}$, respectively, in place of the outputs from the digital signal processing circuits 4a, 74b, 74c. These signals are digital-to-analog converted into the analog signals $A_a$, $A_b$, $A_c$ which are transmitted to the analog signal output terminals 75a, 75b, 75c, respectively, and to the output portion 76.

(I-3) Output Portion 76

The output portion 76 includes three NMOS transistors 76a, 76b, 76c which have gates receiving the selection signal S, and sources commonly connected to the test result output terminal 78. The drains of the transistors 76a, 76b, 76c are connected to the D-A converters 72a, 72b, 72c and receive the analog signals $A_a$, $A_b$, $A_c$, respectively.

When the selection signal S is "L", the transistors 76a, 76b, 76c are off, and the analog signals $A_a$, $A_b$, $A_c$ are applied only to the analog signal output terminals 75a, 75b, 75c, respectively. In normal operation wherein the selection signal S is "L", the digital signals outputted from the digital signal processing circuits 74a, 74b, 74c are impressed upon the D-A converters 72a, 72b, 72c and converted into the analog signals which are in turn outputted from the analog signal output terminals 75a, 75b, 75c, respectively.

When the selection signal S is "H", the transistors 76a, 76b, 76c are on, and all the currents $I_a$, $I_b$, $I_c$ corresponding to the analog signals $A_a$, $A_b$, $A_c$ flow to the test result output terminal 78. Thus, a resistor $R_{EX}$ from the exterior is inserted between the test result output terminal 78 and ground to measure a voltage across the resistor $R_{EX}$, whereby the sum of the currents $I_a$, $I_b$, $I_c$ is detected.

(I-4) Discrimination between Defective and Non-Defective of D-A Converters 72a, 72b, 72c It can be said that the D-A converters 72a, 72b, 72c, if all normal, cause currents having values 0, $I_0$, $2I_0$, $3I_0$ to flow in corresponding relation to the 2-bit digital signals "00", "01", "10", "11", respectively, which are applied to the test signal input terminals 711, 710.

Figure 24:
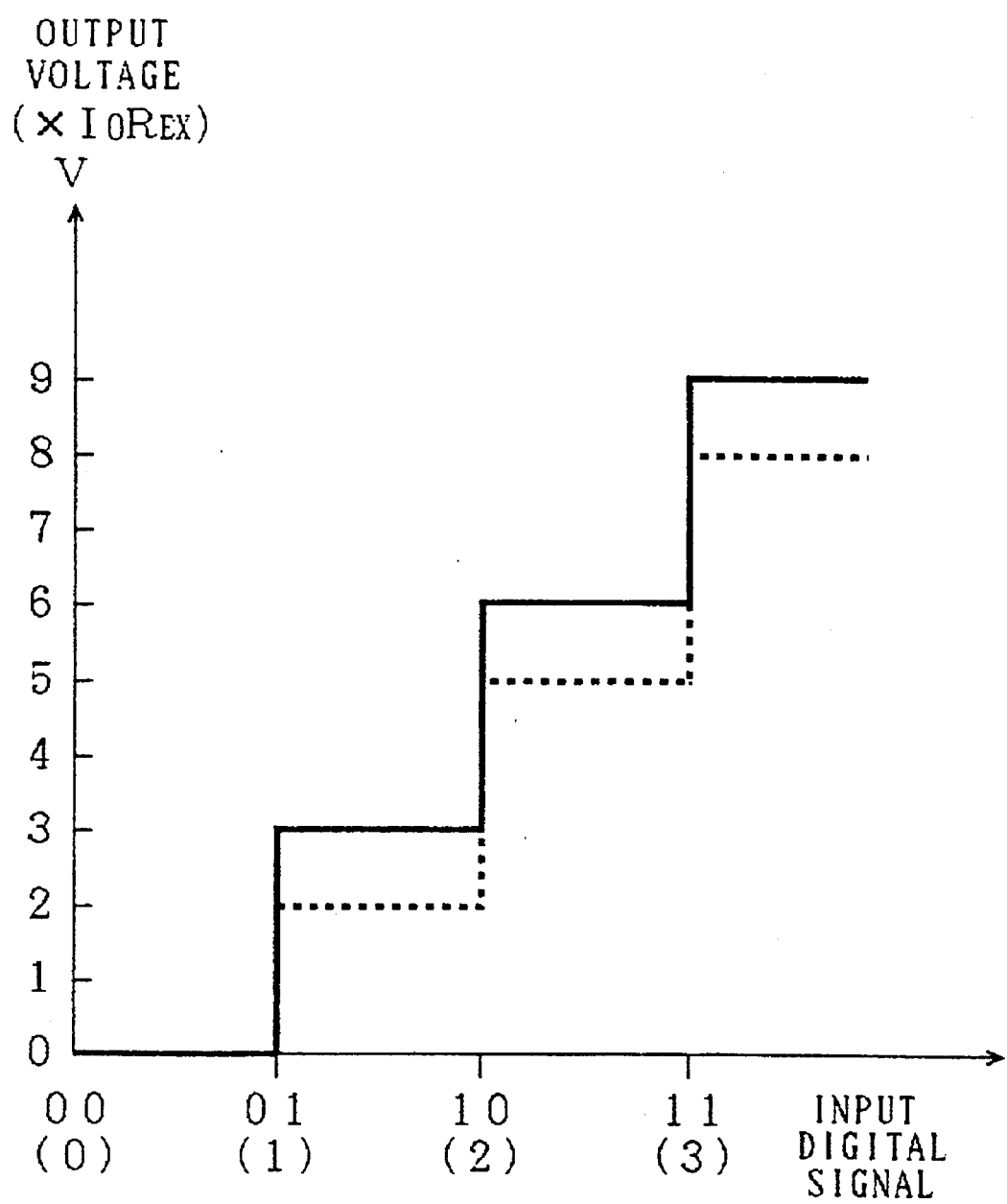
FIG. 24 is a graph showing an operation of the eighth preferred embodiment according to the present invention.

FIG. 24 is a graph showing relation between the 2-bit digital signals applied to the test signal input terminals 711, 710 and the voltage across the resistor $R_{EX}$. As shown in solid lines of FIG. 24, the voltage across the resistor $R_{EX}$ is 0, $3I_0R_{EX}$, $6I_0R_{EX}$, $9I_0R_{EX}$ where the 2-bit digital signal is "00", "01", "10", "11", respectively, when all of the D-A converters 72a, 72b, 72c are normal.

It is assumed that one of the D-A converters 72a, 72b, 72c has such an abnormality as to cause currents having values 0, 0, $I_0$, $2I_0$ to flow where the 2-bit digital signals applied to the test signal input terminals 711, 710 are "00", "01", "10", "11", respectively. Then the voltage across the resistor $R_{EX}$ is 0, $2I_0R_{EX}$, $5I_0R_{EX}$, $8I_0R_{EX}$ in corresponding relation to the "00", "01", "10", "11" 2-bit digital signals, as shown in dotted lines of FIG. 24.

Thus, it is found that the D-A converters 72a, 72b, 72c are normal if the voltage across the resistor $R_{EX}$ increases by equal increments as the 2-bit digital signals applied to the test signal input terminals 711, 710 from the digital signal generator 200 are changed in increments of "01" such as "00", "01", "10", "11". If the increments of the voltage across the resistor $R_{EX}$ are not equal if the 2-bit digital signals are increased by equal increments, it is found that an abnormality occur in the D-A converters 72a, 72b, 72c.

The eighth preferred embodiment can simultaneously judge whether the D-A converters 72a, 72b, 72c are defective or non-defective and, therefore, has the effect of high-speed operation of the judgement.

J. Ninth Preferred Embodiment (J-1) Basic Concept

Figure 25:
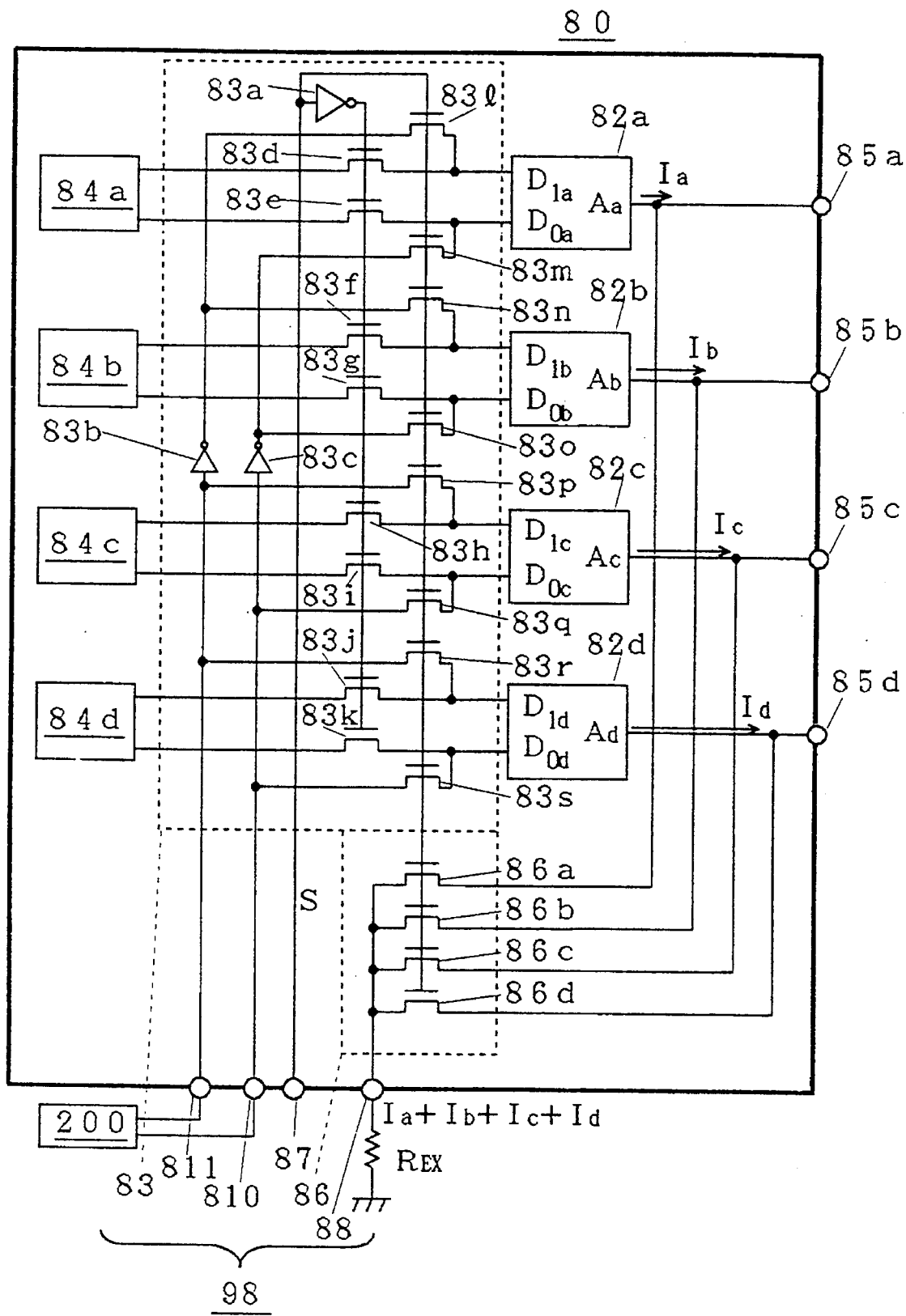
FIG. 25 is a circuit diagram showing a construction of a ninth preferred embodiment according to the present invention.

FIG. 25 is a circuit diagram showing the construction of a semiconductor integrated circuit 80 including a D-A converter testing circuit 98 according to a ninth preferred embodiment of the present invention. The semiconductor integrated circuit 80 comprises 2-bit D-A converters 82a, 82b, 82c, 82d, digital signal processing circuits 84a, 84b, 84c, 84d corresponding to the D-A converters 82a, 82b, 82c, 82d, and the D-A converter testing circuit 98 according to the present invention including test signal input terminals 810, 811, a test signal input circuit 83, an output portion 86, a mode terminal 87, and a test result output terminal 88. There are provided an even number of D-A converters in the ninth preferred embodiment according to the present invention.

The selection signal S is applied to the mode terminal 87. When the selection signal S is "L", the test signal input circuit 83 transmits signals from the digital signal processing circuits 84a, 84b, 84c, 84d to the D-A converters 82a, 82b, 82c, 82d. When the selection signal S is "H", the test signal input circuit 83 transmits test signals applied to the test signal input terminals 810, 811 to the D-A converters 82a, 82b, 82c, 82d.

When the selection signal S is "H", the semiconductor integrated circuit 80 performs a test operation in which it is judged whether the D-A converters 82a, 82b, 82c, 82d are defective or non-defective. The exterior digital signal generator 200 applies the test signals to the test signal input terminals 810, 811.

The D-A converters 82a, 82b, 82c, 82d receive and digital-to-analog convert 2-bit digital signals $D_{1a}D_{0a}$, $D_{1b}D_{0b}$, $D_{1c}D_{0c}$, $D_{1d}D_{0d}$ into analog signals $A_a$, $A_b$, $A_c$, $A_d$ which are outputted in the form of currents $I_a$, $I_b$, $I_c$, $I_d$.

The output portion 86 applies the outputs of the D-A converters 82a, 82b, 82c, 82d to the test result output terminal 88 when the selection signal S is "H" (in test operation) and insulates the test result output terminal 88 when the selection signal S is "L" (in normal operation).

The D-A converters 82a, 82b, 82c, 82d, if all normal, outputs equal analog signals $A_a$, $A_b$, $A_c$, $A_d$ in response to the same digital signal. In the same manner as the eighth preferred embodiment, whether the D-A converters 82a, 82b, 82c, 82d are defective or non-defective is judged by measuring the value of current drawn out of the test result output terminal 88 during the test operation.

(J-2) Test Signal Input Circuit 83

The test signal input circuit 83 includes three inverters 83a, 83b, 83c and sixteen NMOS transistors 83d to 83s.

The drains of the transistors 83d, 83c, 83l, 83m are connected to the D-A converter 82a. The drains of the transistors 83f, 83g, 83n, 83o are connected to the D-A converter 82b. The drains of the transistors 83h, 83i, 83p, 83q are connected to the D-A converter 82c. The drains of the transistors 83j, 83k, 83r, 83s are connected to the D-A converter 82d.

The output of the digital signal processing circuit 84a is impressed upon the sources of the transistors 83d, 83e. The output of the digital signal processing circuit 84b is impressed upon the sources of the transistors 83f, 83g. The output of the digital signal processing circuit 84c is impressed upon the sources of the transistors 83h, 83i. The output of the digital signal processing circuit 84d is impressed upon the sources of the transistors 83j, 83k.

The sources of the transistor 83l, 83n are connected to the test signal input terminal 811 through the inverter 83b, and the sources of the transistors 83p, 83r are connected directly to the test signal input terminal 811. The sources of the transistors 83m, 83o are connected to the test signal input terminal 810 through the inverter 83c, and the sources of the transistors 83q, 83s are connected directly to the test signal input terminal 810.

The selection signal S is impressed upon the gates of the transistors 83l, 83m, 83n, 83o, 83p, 83q, 83r, 83s. The inverse of the selection signal S which is provided by the inverter 83a is impressed upon the gates of the transistors 83d, 83e, 83f, 83g, 83h, 83i, 83j, 83k.

Like the test signal input circuit 83 of the eight preferred embodiment, when the selection signal S is "L", the transistors 83d, 83c, 83f, 83g, 83h, 83i, 83j, 83k are on, and the outputs from the digital signal processing circuits 84a, 84b, 84c, 84d are applied to the D-A converters 82a, 82b, 82c, 82d and provided as the digital signals $D_{1a}D_{0a}$, $D_{1b}D_{0b}$, $D_{1c}D_{0c}$, $D_{1d}D_{0d}$. These digital signals are digital-to-analog converted into the analog signals $A_a$, $A_b$, $A_c$, $A_d$ which are transmitted to the analog signal output terminals 85a, 85b, 85c, 85d, respectively, and to the output portion 86.

Conversely, when the selection signal is "H", the D-A converters 82a, 82b, 82c, 82d receive the signal applied to the test input terminal 811 as the digital signals $D_{1c}$, $D_{1d}$ and the inverse of the signal applied to the test input terminal 811 as the digital signals $D_{1a}$, $D_{1b}$. The D-A converters 82a, 82b, 82c, 82d also receive the signal applied to the test input terminal 810 as the digital signals $D_{0c}$, $D_{0d}$ and the inverse of the signal applied to the test input terminal 810 as the digital signals $D_{0a}$, $D_{0b}$. These signals are digital-to-analog converted into the analog signals $A_a$, $A_b$, $A_c$, $A_d$ which are transmitted to the analog signal output terminal 85a, 85b, 85c, 85d, respectively, and to the output portion 86.

(J-3) Output Portion 86

The output portion 86 includes four NMOS transistors 86a, 86b, 86c, 86d which have gates receiving the selection signal S. Like the output portion 76 of the eighth preferred embodiment, the output portion 86 provides the sum of currents $(I_a+I_b+I_c+I_d)$ to the test result output terminal 88 when the selection signal S is "H". The sum of currents $(I_a+I_b+I_c+I_d)$ is detected by inserting the resistor $R_{EX}$ from the exterior between the test result output terminal 88 and ground to measure the voltage across the resistor $R_{EX}$.

(J-4) Discrimination between Defective and Non-Defective of D-A Converters 82a, 82b, 82c, 82d In test operation, the digital signal $D_{1a}D_{0a}$ applied to the D-A converter 82a is equal to the digital signal $D_{1b}D_{0b}$ applied to the D-A converter 82d. The digital signal $D_{1c}D_{0c}$ applied to the D-A converter 82c is equal to the digital signal $D_{1d}D_{0d}$ applied to the D-A converter 82d.

The inverters 83b, 83c cause the digital signals $D_{1a}D_{0a}$ and $D_{1c}D_{0c}$ to have complementary values. For example, when the digital signal $D_{1a}D_{0a}$ is "00", "01", "10", "11", then the digital signal $D_{1c}D_{0c}$ is "11", "10", "01", "00", respectively.

Thus, when all of the D-A converters 82a, 82b, 82c, 82d are in normal operation, the sum of currents $(I_a+I_b+I_c+I_d)$ are held constant independent of the value of the digital signals applied to the test input terminals 810, 811.

For example, it is assumed that the D-A converters 82a, 82b, 82c, 82d output currents having values 0, $I_0$, $2I_0$, $3I_0$ in corresponding relation to the applied 2-bit digital signals "00", "01", "10", "11", respectively, similarly to the eighth preferred embodiment. The currents $I_a$, $I_b$, $I_c$, $I_d$ have the values shown in Table 1 where $D_1$ is the digital signal applied to the test input terminal 810 and $D_0$ is the digital signal applied to the test input terminal 811.

TABLE 1

| $D_1D_0$ | $I_a$ | $I_b$ | $I_c$ | $I_d$ |
|---|---|---|---|---|
| 00 | $3I_0$ | $3I_0$ | 0 | 0 |
| 01 | $2I_0$ | $wI_0$ | $I_0$ | $I_0$ |
| 10 | $I_0$ | $I_0$ | $2I_0$ | $2I_0$ |
| 11 | 0 | 0 | $3I_0$ | $3I_0$ |

Therefore, when all of the D-A converters 82a, 82b, 82c, 82d operate normally, the sum of currents $(I_a+I_b+I_c+I_d)$ is held at a constant value $6I_0$ independent of the value of the digital signals applied to the test input terminals 810, 811.

Assuming that the A-D converter 82a is abnormal and outputs current having the values 0, 0, $I_0$, $2I_0$ in corresponding relation to the 2-bit digital signals "00", "01", "10", "11", respectively, then the currents $I_a$, $I_b$, $I_c$, $I_d$ have the values shown in Table 2 when the digital signal $D_1D_0$ is applied to the test input terminals 810, 811.

TABLE 2

| $D_1D_0$ | $I_a$ | $I_b$ | $I_c$ | $I_d$ |
|---|---|---|---|---|
| 00 | $2I_0$ | $3I_0$ | 0 | 0 |
| 01 | $I_0$ | $2I_0$ | $I_0$ | $I_0$ |
| 10 | 0 | $I_0$ | $2I_0$ | $2I_0$ |
| 11 | 0 | 0 | $3I_0$ | $3I_0$ |

In this case, the sum of currents $(I_a+I_b+I_c+I_d)$ has two values $5I_0$ and $6I_0$ depending on the value of the digital signals applied to the test input terminals 810, 811.

In the ninth preferred embodiment, an even number of D-A converters are divided into two pairs (herein the pair of D-A converters 82a, 82b and the pair of D-A converters 82c, 82d) to which the complementary test signals are applied respectively. Thus current having a constant value is provided from the test result output terminal 88 independent of the test signal value when all of the D-A converters are normal. The constant value is not provided when an abnormality occurs. This provides for rapid judgement whether all of the D-A converters are defective or non-defective.

K. Tenth Preferred Embodiment

Concrete description is given on the techniques for testing the A-D converters in the first to seventh preferred embodiments and for testing the D-A converters in the eighth and ninth preferred embodiments. A test circuit for testing both A-D converters and D-A converters may be achieved.

Figure 26:
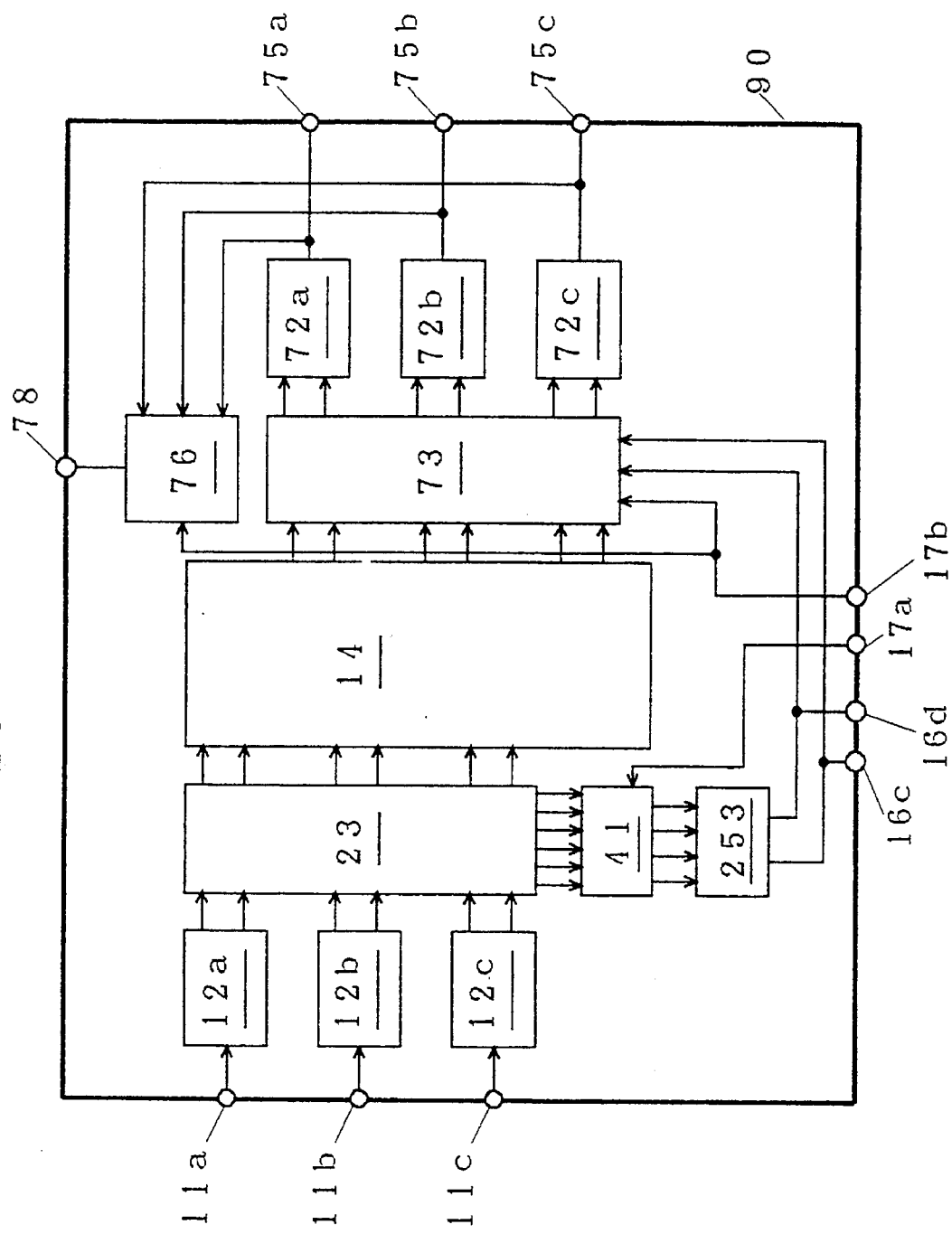
FIG. 26 is a block diagram showing a construction of a tenth preferred embodiment according to the present invention.

FIG. 26 is a block diagram showing the construction of a semiconductor integrated circuit 90 including the test circuit of a tenth preferred embodiment according to the present invention. The semiconductor integrated circuit 90 comprises the analog input terminals 11a, 11b, 11c, the analog signal output terminals 75a, 75b, 75c, input-output terminals 16c, 16d, and the test result output terminal 78. The semiconductor integrated circuit 90 further comprises the A-D converters 12a, 12b, 12c connected to the analog input terminals 11a, 11b, 11c, respectively, and the D-A converters 72a, 72b, 72c connected to the analog signal output terminals 75a, 75b, 75c, respectively.

The semiconductor integrated circuit 90 further comprises a digital signal processing circuit 14. The A-D converters 12a, 12b, 12c are connected to the digital signal processing circuit 14 through the coincidence detecting circuit 23. The D-A converters 72a, 72b, 72c are connected to the digital signal processing circuit 14 through the test signal input circuit 73.

The coincidence detecting circuit 23 is connected to the switching portion 41, which is in turn connected to the output portion 253, similarly to the sixth preferred embodiment. The output portion 76 is connected between the D-A converters 72a, 72b, 72c and the test result output terminal 78, similarly to the eighth preferred embodiment. The output portion 253 and the test signal input circuit 73 are connected to both the input-output terminals 16c, 16d.

A mode terminal 17a is connected to the switching portion 41. The switching portion 41 applies the output of the coincidence detecting circuit 23 to the output portion 253 when the logic "H" is applied to the mode terminal 17a, but does not so when the logic "L" is applied. That is, the mode terminal 17a corresponds to the mode terminal 17 of the sixth preferred embodiment.

A mode terminal 17b is connected to the test signal input circuit 73 and the output portion 76. If the logic "H" is applied to the mode terminal 17b, the test signal is applied to the test signal input circuit 73, and the output portion 76 applies the converted current outputted from the D-A converters 72a, 72b, 72c to the test result output terminal 78. If the logic "L" is applied to the mode terminal 17b, the output of the digital signal processing circuit 14 is applied to the test signal input circuit 73, and the output portion 76 does not apply the converted current to the test result output terminal 78. That is, the mode terminal 17b corresponds to the mode terminal 77 of the eighth preferred embodiment.

The input-output terminals 16c, 16d are bidirectional terminals and function as the test result output terminals 16a, 16b of the sixth preferred embodiment when the mode terminal 17a is "H" and as the test signal input terminals 710, 711 of the eighth preferred embodiment when the mode terminal 17b is "H".

If both of the mode terminals 17a, 17b are "L", the semiconductor integrated circuit 90 tests neither the D-A converters nor the A-D converters, but performs normal functions, in the same manner as the semiconductor integrated circuit 101 of FIG. 27. Specifically, the semiconductor integrated circuit 90 converts the analog signals into digital signals, processes the digital signals, and converts the processed digital signals into analog signals. The mode terminals 17a, 17b which are both "H" are inhibited.

In the tenth preferred embodiment of the present invention, as above described, the D-A converters and A-D converters formed in the same semiconductor integrated circuit are rapidly tested similarly to the sixth and eighth preferred embodiments.

It should be noted in the tenth preferred embodiment that similar effects are provided if the coincidence detecting circuit 23 is replaced with the coincidence detecting circuit 13 and the output portion 253 is replaced with the output portion 153 as stated in the sixth preferred embodiment. As stated in the ninth preferred embodiment, high-speed test can be performed if the test signal input circuit 73 is replaced with the test signal input circuit 83 and the output portion 76 is replaced with the output portion 86 in the case where an even number of D-A converters are provided.

While the invention has been shown and described in detail, the foregoing description is in all aspects illustrative and not restrictive. It is therefore understood that numerous modifications and variations can be devised without departing from the scope of the invention.

What is claimed is:

1. An A-D converter testing circuit for testing whether a plurality of A-D converters are defective or non-defective, each of said plurality of A-D converters providing a converter output that is a digital signal, said A-D converter testing circuit comprising:

(a) a coincidence detecting circuit for detecting whether or not all of the converter outputs of said A-D converters coincide to output a coincidence detection signal; and (b) an output portion controlled by said coincidence detection signal for providing a test result output indicative of the defective/non-defective of said A-D converters.

2. The A-D converter testing circuit of claim 1, wherein said A-D converters are included in a semiconductor integrated circuit, and said A-D converter testing circuit is included in said semiconductor integrated circuit.

3. The A-D converter testing circuit of claim 1, further comprising:

(c) a switching portion for controlling whether to transmit said coincidence detection signal to said output portion or not.

4. The A-D converter testing circuit of claim 1, wherein said coincidence detecting circuit detects whether or not said converter outputs coincide for each bit forming said converter outputs.

5. The A-D converter testing circuit of claim 4, wherein said coincidence detection signal has different complementary values depending on whether or not corresponding bits of said converter outputs are equal in the respective A-D converters, and said coincidence detecting circuit further outputs one of said converter outputs outputted from one of said A-D converters.

6. The A-D converter testing circuit of claim 5, wherein said output portion outputs said one converter output as said test result output when the corresponding bits of said converter outputs are equal in all of said A-D converters, and said test result output is in a high-impedance state when the corresponding bits of said converter outputs are different in at least one pair of said A-D converters.

7. The A-D converter testing circuit of claim 5, wherein the number of said plurality of A-D converters is N (N≧2), and said coincidence detecting circuit includes:
(a-1) a K-th exclusive-OR gate (1≦K≦(N−1)) having two inputs receiving the corresponding bits of said converter outputs outputted from K-th and (K+1)-th A-D converters, and an output providing the exclusive-OR of its inputs; and
(a-2) an OR gate having (N−1) inputs connected to the outputs of said first to (N−1)-th exclusive-OR gates, and an output providing the logical sum of its inputs as said coincidence detection signal.

8. The A-D converter testing circuit of claim 7, wherein said output portion includes
(b-1) a tri-state buffer having a control end receiving said coincidence detection signal, an input receiving said one converter output, and an output, and wherein said tri-state buffer causes its output to enter the high-impedance state upon receipt of the logic "H" at its control end, and transmits a value at its input to its output upon receipt of the logic "L" at its control end.

9. The A-D converter testing circuit of claim 8, wherein said tri-state buffer includes:
(b-1-1) a high potential point upon which a potential corresponding to the logic "H" is impressed;
(b-1-2) a low potential point upon which a potential corresponding to the logic "L" is impressed;
(b-1-3) a first PMOS transistor having a gate receiving the inverse of the logical product of the value applied to said input of said tri-state buffer and a value complementary to the value applied to said control end, a source connected to said high potential point, and a drain; and
(b-1-4) a first NMOS transistor having a gate receiving the inverse of the logical sum of the value applied to said input of said tri-state buffer and the value applied to said control end, a source connected to said low potential point, and a drain, and wherein said output portion further includes:
(b-2) a second NMOS transistor having a gate connected to said gate of said first PMOS transistor, a source connected to said low potential point, and a drain connected to said output of said tri-state buffer in common with the drain of said first PMOS transistor; and
(b-3) a second PMOS transistor having a gate connected to said gate of said first NMOS transistor, a source connected to said high potential point, and a drain connected to said output of said tri-state buffer in common with said drain of said first NMOS transistor.

10. The A-D converter testing circuit of claim 4, wherein said coincidence detection signal is divided into first and second detection signals;

said first and second detection signals are equal when corresponding bits of said converter outputs are equal in all of said A-D converters; and said first and second detection signals have complementary values when the corresponding bits of said converter outputs are different in at least one pair of said A-D converters.

11. The A-D converter testing circuit of claim 10, wherein said first and second detection signals are both "L" when the corresponding bits of said converter outputs are "H" in all of said A-D converters;

said first and second detection signals are both "H" when the corresponding bits of said converter outputs are "L" in all of said A-D converters; and said first detection signal is "H" and said second detection signal is "L" when the corresponding bits of said converter outputs are different in at least one pair of said A-D converters.

12. The A-D converter testing circuit of claim 10, wherein said test result output has a value complementary to said first and second detection signals when said first and second detection signals are equal; and said test result output is in a high-impedance state when said first and second detection signals are different from each other.

13. The A-D converter testing circuit of claim 11, wherein said coincidence detecting circuit includes:
(a-3) an NAND gate having a plurality of inputs receiving the corresponding bits of said converter outputs of all of said A-D converters, and an output providing the inverse of the logical product of its inputs; and
(a-4) an NOR gate having a plurality of inputs receiving the corresponding bits of said converter outputs of all of said A-D converters, and an output providing the inverse of the logical sum of its inputs.

14. The A-D converter testing circuit of claim 11, wherein said coincidence detecting circuit includes:
(a-5) a high potential point upon which a potential corresponding to the logic "H" is impressed;
(a-6) a low potential point upon which a potential corresponding to the logic "L" is impressed;
(a-7) first and second outputs for providing said first and second detection signals, respectively;
(a-8) a first resistor connected between said first output and said high potential point;
(a-9) a second resistor connected between said second output and said low potential point;
(a-10) a plurality of NMOS transistors provided in corresponding relation to said A-D converters and connected in series between said low potential point and said first output; and
(a-11) a plurality PMOS transistors provided in corresponding relation to said A-D converters and connected in series between said high potential point and said second output, and wherein said plurality of NMOS and PMOS transistors have gates connected to said A-D converters corresponding thereto and receiving said converter outputs, respectively.

15. The A-D converter testing circuit of claim 11, wherein said output portion includes:
  (b-1) a high potential point upon which a potential corresponding to the logic "H" is impressed;
  (b-2) a low potential point upon which a potential corresponding to the logic "L" is impressed;
  (b-3) a first PMOS transistor having a gate receiving said first detection signal, a source connected to said high potential point, and a drain;
  (b-4) a first NMOS transistor having a gate receiving said second detection signal, a source connected to said low potential point, and a drain; and
  (b-5) a test result output terminal commonly connected to the drains of said first PMOS and first NMOS transistors for providing said test result output.

16. The A-D converter testing circuit of claim 15, wherein said output portion further includes:
  (b-6) a second NMOS transistor having a gate receiving said first detection signal, a source connected to said low potential point, and a drain; and
  (b-7) a second PMOS transistor having a gate receiving said second detection signal, a source connected to said high potential point, and a drain.

17. An A-D converter testing circuit for testing whether M A-D converters are defective or non-defective, each of said M A-D converters providing a converter output that is an N-bit digital signal, said A-D converter testing circuit comprising:
  (a) switches $S_{KL}$ ($1 \leq K \leq M$, $1 \leq L \leq N$) each having a first end, a second end receiving an L-th bit of the converter output outputted from a K-th one of said A-D converters, and a control end for controlling whether to transmit a value impressed upon its second end to its first end or not;
  (b) a control terminal commonly connected to all of the control ends of said switches $S_{KL}$ and receiving a selection signal; and
  (c) test result output terminals $T_L$ for commonly connecting the first ends of said switches $S_{1L}, S_{2L}, \ldots, S_{ML}$ to each other.

18. The A-D converter testing circuit of claim 17,
  wherein said A-D converters are formed in a semiconductor integrated circuit, and said semiconductor integrated circuit further includes a digital signal processing circuit for processing said converter outputs,
  said A-D converter testing circuit further comprising:
  (d) switches $W_{KL}$ each having a first end connected to said digital signal processing circuit, a second end receiving the L-th bit of the converter output outputted from the K-th A-D converter, and a control end for controlling whether to transmit a value impressed upon its second end to its first end or not,
  said control ends of said switches $W_{KL}$ receiving a value complementary to said selection signal.

19. The A-D converter testing circuit of claim 18, wherein each of said switches $S_{KL}$ and $W_{KL}$ includes an NMOS transistor, and said control ends correspond to gates of said NMOS transistors.

20. The A-D converter testing circuit of claim 17, wherein each of said A-D converters includes:
  (x-1) an output receiving said converter output;
  (x-2) a high potential point upon which a potential corresponding to the logic "H" is impressed;
  (x-3) a low potential point upon which a potential corresponding to the logic "L" is impressed;
  (x-4) a PMOS transistor having a drain connected to said output, and a source connected to said high potential point; and
  (x-5) an NMOS transistor having a drain connected to said output, and a source connected to said low potential point.

21. A D-A converter testing circuit for providing a test output indicative of whether a plurality of D-A converters are defective or non-defective, each of said D-A converters digital-to-analog converting a common digital signal to provide a converted current, said D-A converter testing circuit comprising:
  (a) a test signal input circuit for applying a digital test signal to each of said D-A converters; and
  (b) an output portion for outputting the test output comprising the sum of the converted currents of said D-A converters, whereby all of the D-A converters are normal only when the sum of said converted currents change in proportion to a changed amount of said common digital signal.

22. The D-A converter testing circuit of claim 21, wherein said D-A converters are included in a semiconductor integrated circuit, and said D-A converter testing circuit is included in said semiconductor integrated circuit.

23. The D-A converter testing circuit of claim 21, wherein each of said D-A converters has N inputs for receiving an N-bit digital signal, one input for each bit of the N-bit digital signal, and digital-to-analog converts said digital signal to provide said converted current,
  the number of said D-A converters being M,
  said test signal being composed of N bits,
  said D-A converter testing circuit further comprising:
  (c) N test signal input terminals receiving said test signal for each bit;
  (d) a test result output terminal;
  (e) switches $S_{KL}$ ($1 \leq K \leq M$, $1 \leq L \leq N$) each having a first end connected to an L-th one of the inputs of a K-th one of said D-A converters, a second end connected to an L-th one of said test signal input terminals, and a control end for controlling whether to transmit a value impressed upon its second end to its first end or not;
  (f) a control terminal commonly connected to all of the control ends of said switches $S_{KL}$ and receiving a selection signal; and
  (g) an output portion for controlling whether to apply all of said converted currents of said D-A converters to said test result output terminal on the basis of said selection signal.

24. The D-A converter testing circuit of claim 23,
  wherein said D-A converters are formed in a semiconductor integrated circuit, and said semiconductor integrated circuit further includes a digital signal output circuit for outputting said digital signal,
  said D-A converter testing circuit further comprising:
  (h) switches $W_{KL}$ each having a first end connected to said digital signal output circuit, a second end connected to the second end of a corresponding one of said switches $S_{KL}$, and a control end for controlling whether to transmit a value impressed upon its second end to its first end or not,
  the control ends of said switches $W_{KL}$ receiving a value complementary to said selection signal.

25. The D-A converter testing circuit of claim 24, wherein each of said switches $S_{KL}$ and $W_{KL}$ includes an NMOS transistor, and said control ends correspond to gates of said NMOS transistors.

26. The D-A converter testing circuit of claim 23, wherein said output portion includes:
   (g-1) switches $Q_K$ ($1 \leq K \leq M$) each having a first end receiving the converted current of the K-th D-A converter, a second end connected to said test result output terminal, and a control end receiving said selection signal.

27. The D-A converter testing circuit of claim 26, wherein each of said switches $Q_K$ includes an NMOS transistor, and said control ends correspond to gates of said NMOS transistors.

28. A D-A converter testing circuit for providing a test output indicative of whether 2M D-A converters are defective or non-defective, each of said 2M D-A converters having N inputs for receiving an N-bit digital signal, one input for each bit of the N-bit digital signal, and digital-to-analog converting said digital signal to provide a converted current, said D-A converter testing circuit comprising:
   (a) N test signal input terminals receiving an N-bit test signal for each bit;
   (b) a test result output terminal;
   (c) switches $S_{JL}$ ($1 \leq J \leq M$, $1 \leq L \leq N$) each having a first end connected to an L-th one of said inputs of a J-th one of said D-A converters, a second end receiving a value applied to an L-th one of said test signal input terminals, and a control end for controlling whether to transmit a value impressed upon its second end to its first end or not;
   (d) switches $S_{JL}$ (($M+1$)$\leq K \leq 2M$) each having a first end connected to the L-th input of a K-th one of said D-A converters, a second end receiving a value complementary to the value applied to the L-th test signal input terminal, and a control end for controlling whether to transmit a value impressed upon its second end to its first end or not;
   (e) a control terminal commonly connected to all of the control ends of said switches $S_{JL}$, $S_{KL}$ and receiving a selection signal; and
   (f) an output portion for controlling whether to apply the test output comprising all of the converted currents of said D-A converters to said test result output terminal or not on the basis of said selection signal.

29. The D-A converter testing circuit of claim 28, wherein said D-A converters are formed in a semiconductor integrated circuit, and said semiconductor integrated circuit further includes a digital signal output circuit for outputting said digital signal,
said D-A converter testing circuit further comprising:
   (g) switches $W_{IL}$ ($1 \leq I \leq 2M$) each having a first end connected to said digital signal output circuit, a second end connected to the second end of an L-th one of said switches $S_{JL}$ for an I-th one of said D-A converters, and a control end for controlling whether to transmit a value impressed upon its second end to its first end or not,
the control ends of said switches $W_{IL}$ receiving a value complementary to said selection signal.

30. The D-A converter testing circuit of claim 29, wherein each of said switches $S_{JL}$, $S_{KL}$, $W_{IL}$ includes an NMOS transistor, and said control ends correspond to gates of said NMOS transistors.

31. The D-A converter testing circuit of claim 28, wherein said output portion includes:
   (f-1) switches $Q_I$ each having a first end receiving the converted current of an I-th one of said D-A converters, a second end connected to said test result output terminal, and a control end receiving said selection signal.

32. The D-A converter testing circuit of claim 31, wherein each of said switches $Q_I$ includes an NMOS transistor, and said control ends correspond to gates of said NMOS transistors.

33. A testing circuit comprising:
   (a) an A-D converter testing circuit for testing whether a plurality of A-D converters are defective or non-defective, each of said plurality of A-D converters providing a converter output that is a digital signal;
   (b) a D-A converter testing circuit for providing a test output indicative of whether a plurality of D-A converters are defective or non-defective, each of said plurality of D-A converters digital-to-analog converting a digital signal to provide a converted current; and
   (c) a bi-directional terminal,
   said A-D converter testing circuit including:
      (a-1) a coincidence detecting circuit for detecting whether all of said converter outputs of said A-D converters coincide or not to output a coincidence detection signal;
      (a-2) a first output portion controlled by said coincidence detection signal for providing a test result output indicative of the defective/non-defective of said A-D converters; and
      (a-3) a switching portion between said coincidence detecting circuit and said first output portion for transmitting or not transmitting the output of said coincidence detecting circuit to said first output portion by a first control signal, said D-A converter testing circuit including:
      (b-1) a test signal input circuit for applying a digital test signal to said DA converters; and
      (b-2) a second output portion for outputting or not outputting the test output comprising a sum of the converted currents of said D-A converters by a second control signal,
   said bi-directional terminal being commonly connected to said first output portion and said test signal input circuit,
   said bi-directional terminal (c-1) providing said test result output when said first control signal is active, and (c-2) receiving said test signal when said second control signal is active.

* * * * *